US012578181B2

(12) United States Patent
Yamaguchi

(10) Patent No.: US 12,578,181 B2
(45) Date of Patent: Mar. 17, 2026

(54) MEASURING METHOD, MEASURING APPARATUS, LITHOGRAPHY APPARATUS, AND ARTICLE MANUFACTURING METHOD

(71) Applicant: CANON KABUSHIKI KAISHA, Tokyo (JP)

(72) Inventor: Wataru Yamaguchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 291 days.

(21) Appl. No.: 18/331,986

(22) Filed: Jun. 9, 2023

(65) Prior Publication Data

US 2023/0408249 A1 Dec. 21, 2023

(30) Foreign Application Priority Data

Jun. 16, 2022 (JP) ................................. 2022-097424
Feb. 28, 2023 (JP) ................................. 2023-030136

(51) Int. Cl.
*G03F 9/00* (2006.01)
*G01B 11/00* (2006.01)

(52) U.S. Cl.
CPC .......... *G01B 11/002* (2013.01); *G03F 9/7046* (2013.01); *G03F 9/7088* (2013.01)

(58) Field of Classification Search
CPC ............. G03F 7/706831; G03F 9/7046; G03F 9/7088; G01B 11/002
See application file for complete search history.

(56) References Cited

U.S. PATENT DOCUMENTS

| | | | |
|---|---|---|---|
| 7,312,881 B2 * | 12/2007 | Shchegrov | ........... G01N 21/211 |
| | | | 257/E21.525 |
| 7,439,001 B2 | 10/2008 | Ausschnitt et al. | |
| 12,360,062 B1 * | 7/2025 | Liman | .............. G01N 23/20083 |

FOREIGN PATENT DOCUMENTS

| | | | |
|---|---|---|---|
| CN | 110582729 A | 12/2019 | |
| CN | 113838729 A | 12/2021 | |
| JP | 3630189 B2 * | 3/2005 | ......... G03F 7/70358 |
| JP | 2005351703 A * | 12/2005 | |

(Continued)

OTHER PUBLICATIONS

Office Action issued in Taiwanese Appln. No. 112121446, dated Jan. 8, 2026.

*Primary Examiner* — Peter B Kim
(74) *Attorney, Agent, or Firm* — ROSSI, KIMMS & McDOWELL LLP

(57) ABSTRACT

A measuring method includes performing preliminary measurement, while changing a combination of parameter values of at least two different measurement parameters, concerning each combination, performing processing to obtain a sensitivity distribution as a distribution of sensitivities indicating a change in measurement value with a change in parameter value concerning each of the at least two measurement parameters based on measurement values obtained in the performing preliminary measurement, determining a parameter value to be used concerning each of the at least two measurement parameters based on the sensitivity distribution concerning each of the at least two measurement parameters, and performing main measurement in accordance with the parameter value of each of the at least two measurement parameters determined in the determining.

22 Claims, 15 Drawing Sheets

(56) References Cited

FOREIGN PATENT DOCUMENTS

| | | | |
|---|---|---|---|
| JP | 4792833 | B2 | 10/2011 |
| JP | 6872593 | B2 | 5/2021 |
| KR | 1020150099853 | A | 9/2015 |
| KR | 1020180136902 | A | 12/2018 |

* cited by examiner

F I G.  2A     F I G.  2B
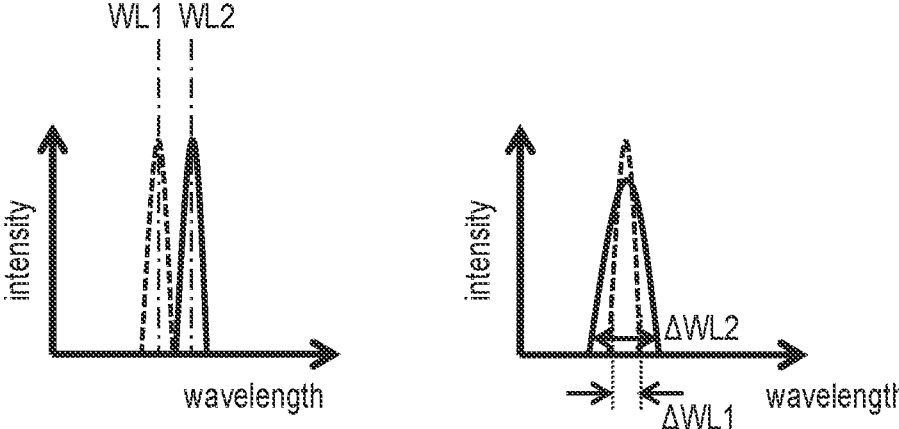
F I G.  2C
| | WL1 | WL2 | · · · | WLj | | Δ |
|---|---|---|---|---|---|---|
| Z1 | M11 | M12 | · · · | M1j | | B1 |
| Z2 | M21 | M22 | · · · | M2j | | B2 |
| ⋮ | ⋮ | ⋮ | | ⋮ | | ⋮ |
| Zi | Mi1 | Mi2 | · · · | Mij | | Bi |
| Δ | A1 | A2 | · · · | Aj | | |

F I G. 4
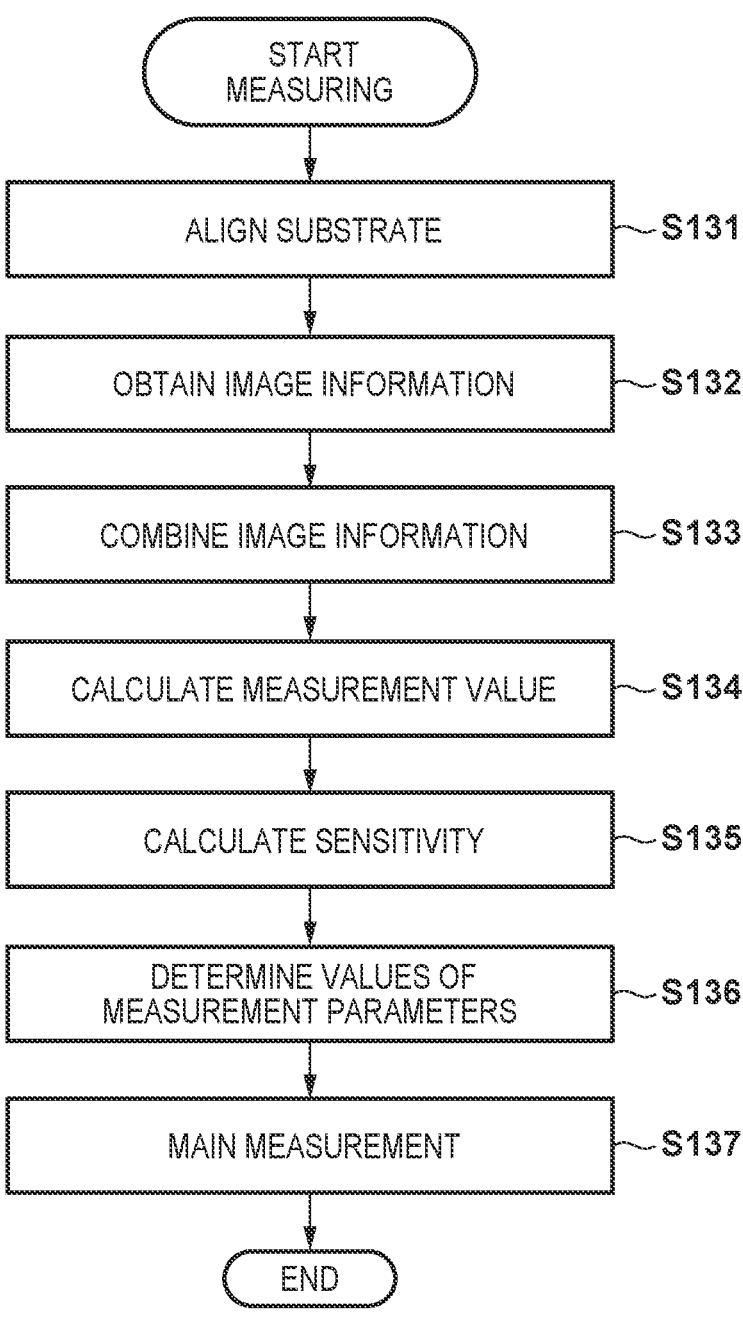

F I G.  8
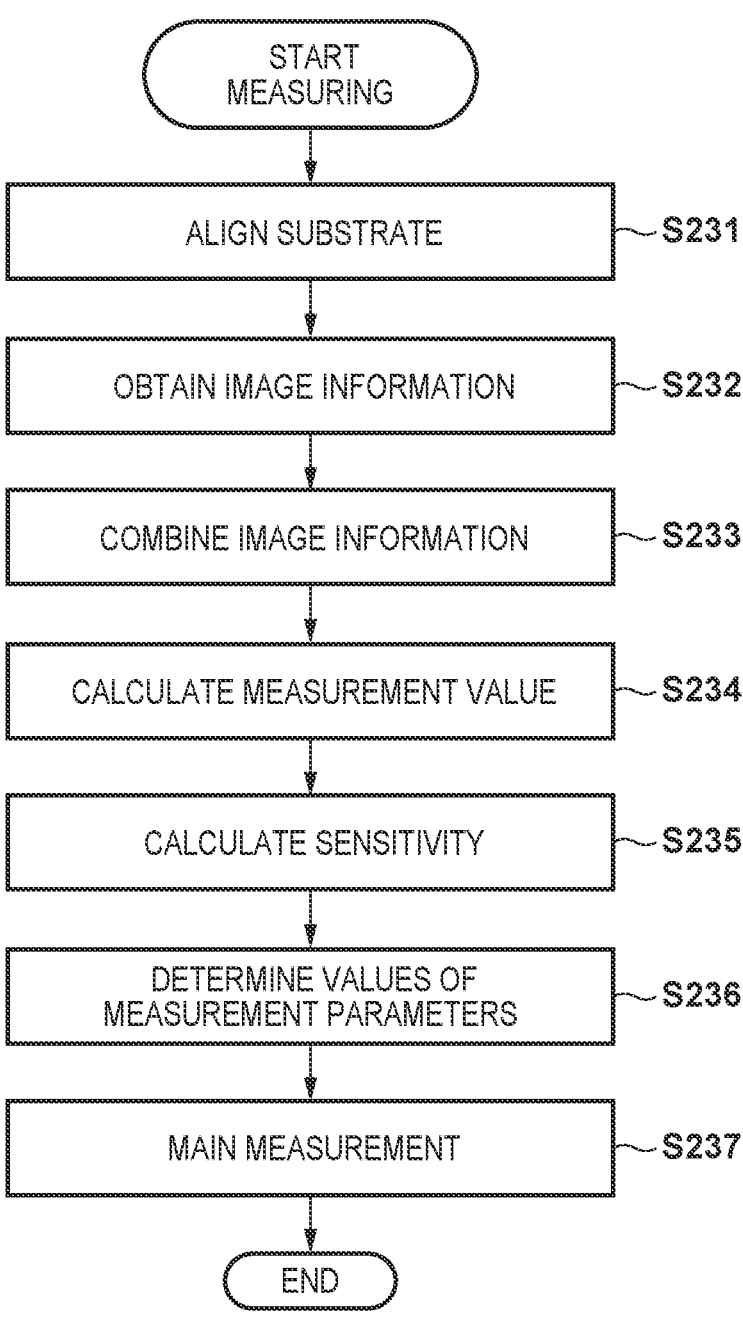

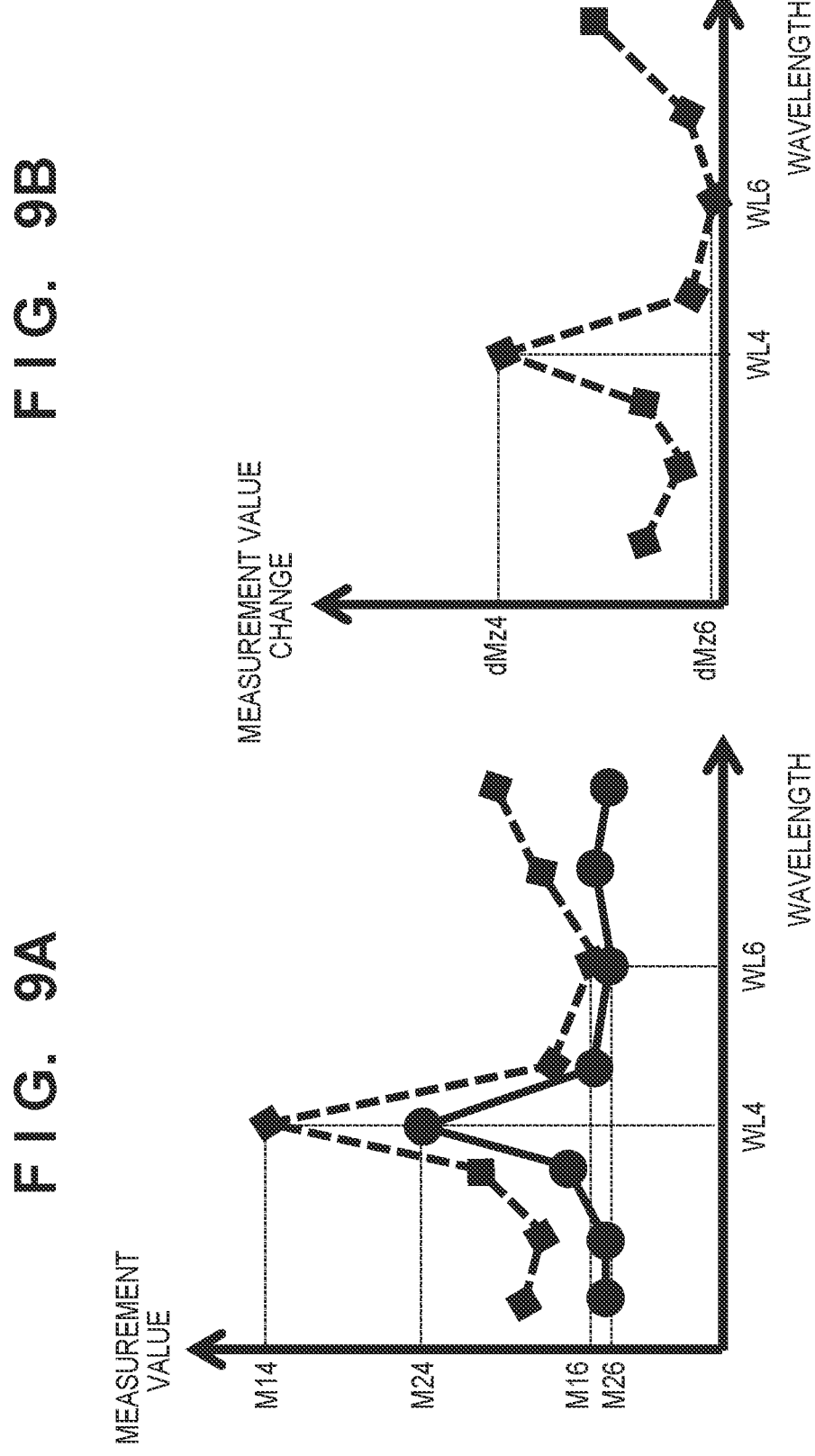

FIG. 10B
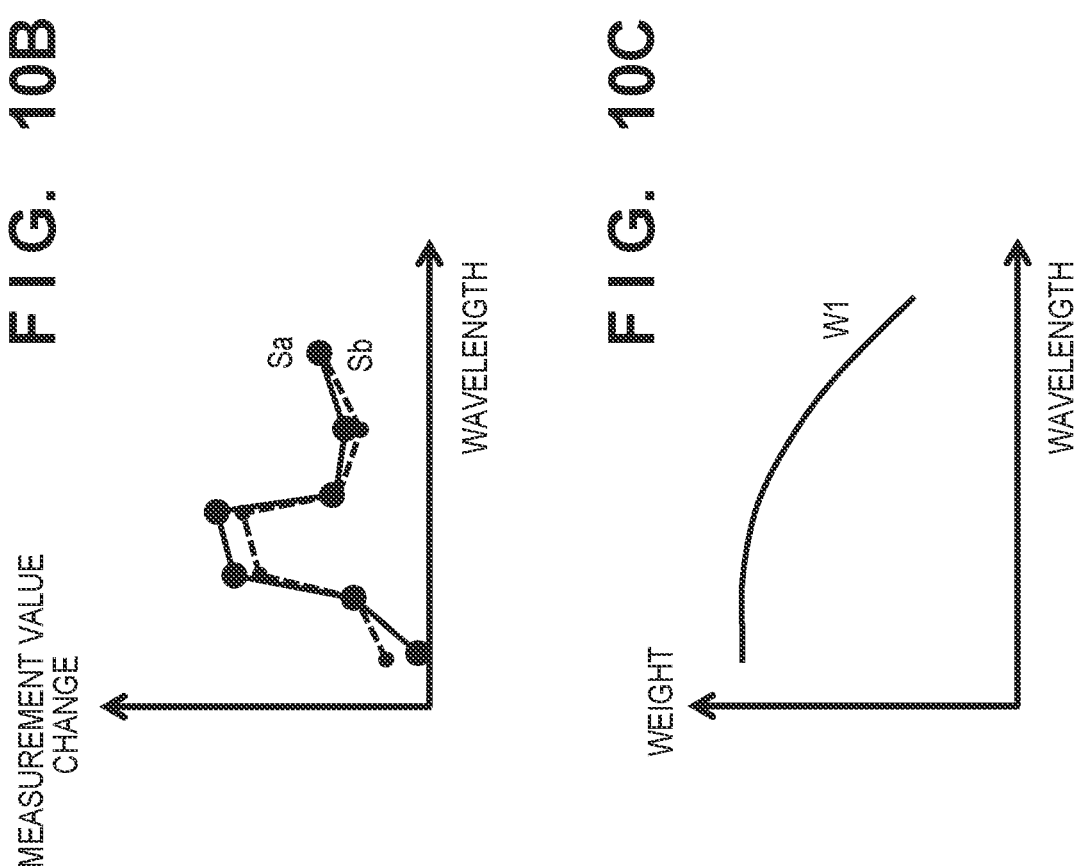
FIG. 10C
FIG. 10A
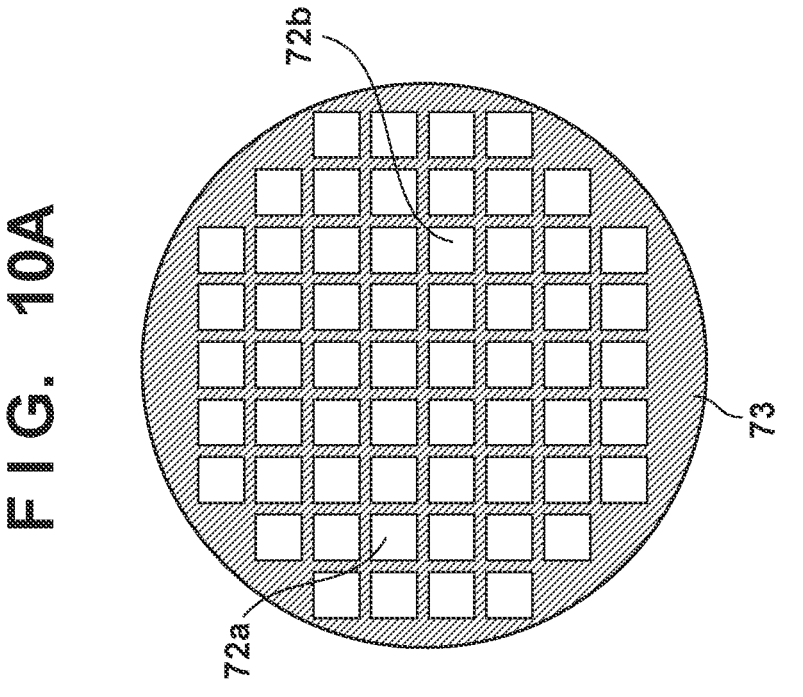

F I G. 11A

F I G. 11B

F I G.  11C
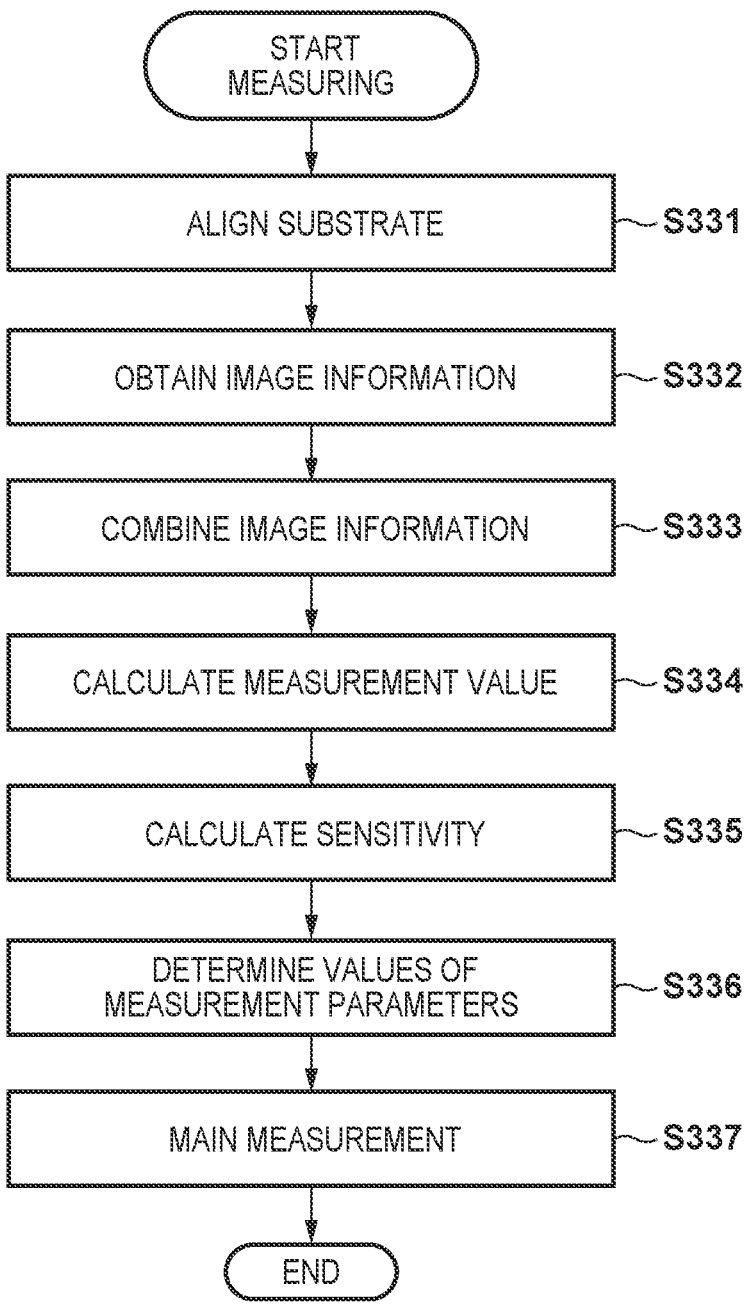

F I G. 12
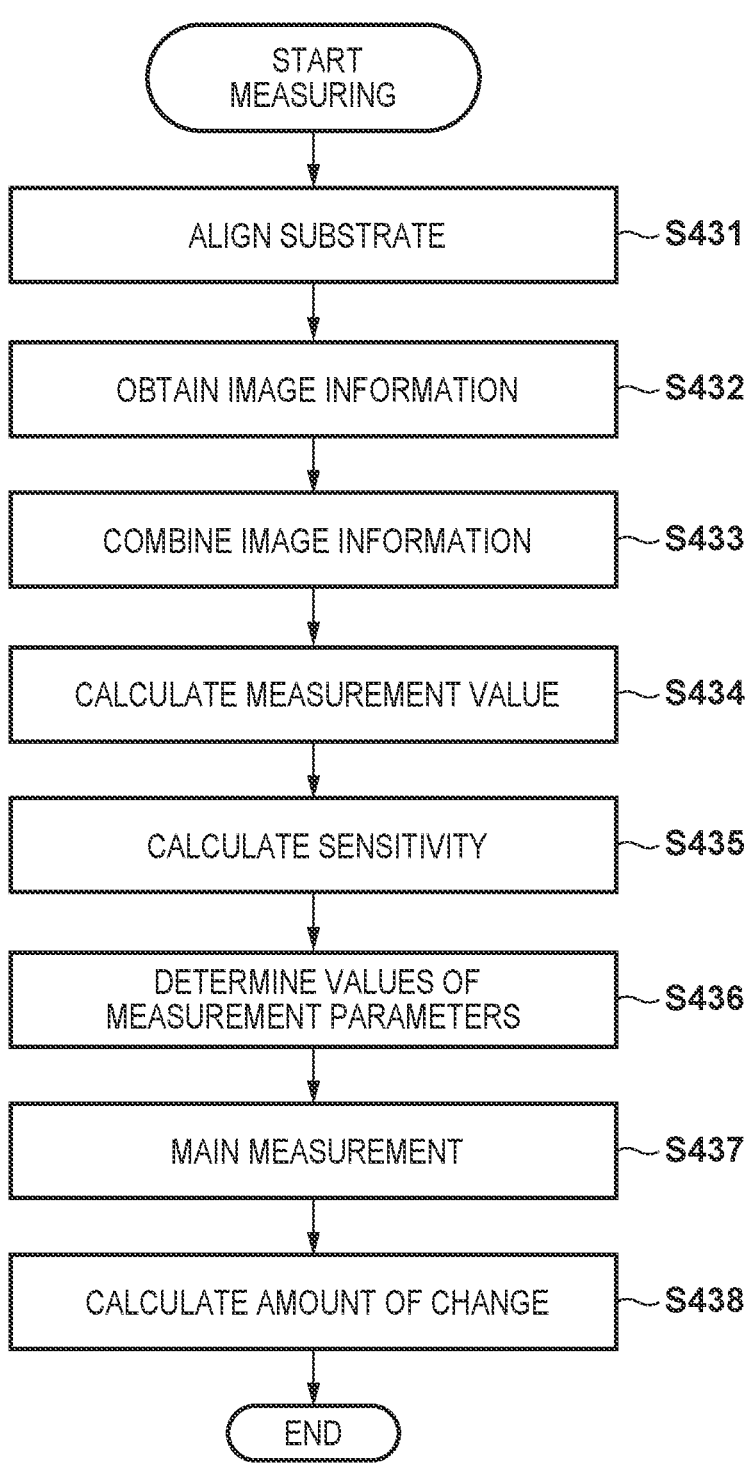

F I G.  13
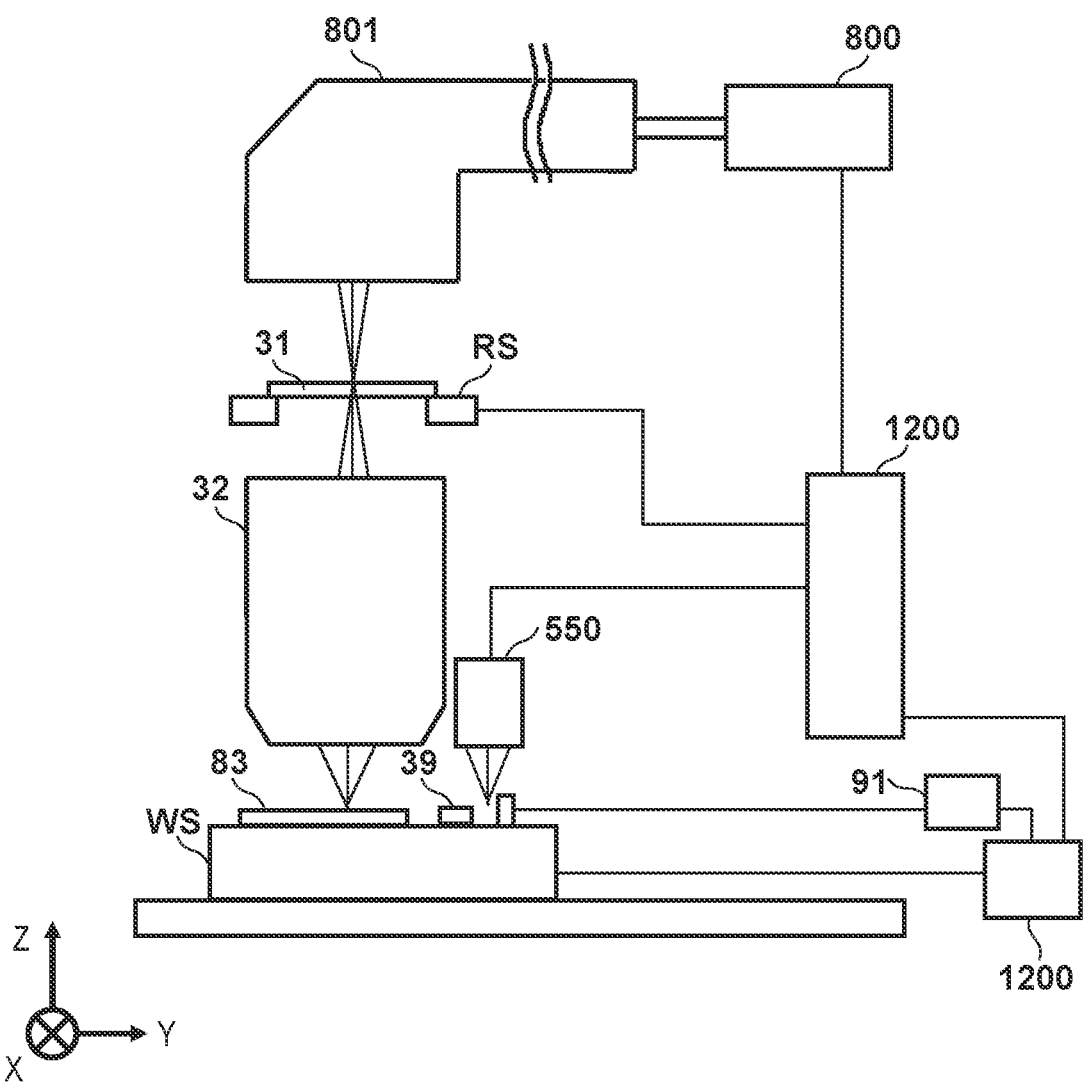

F I G. 14
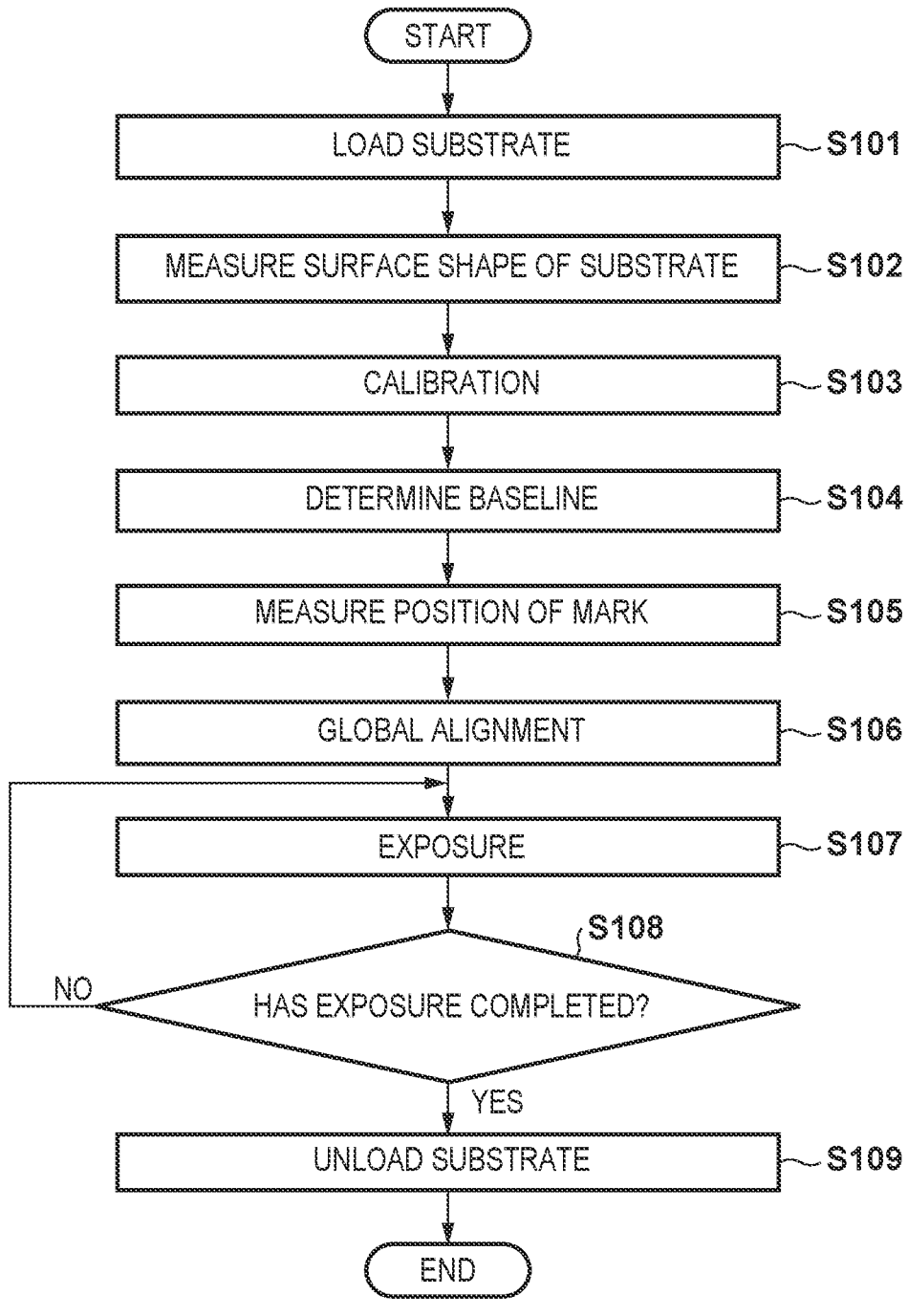

MEASURING METHOD, MEASURING APPARATUS, LITHOGRAPHY APPARATUS, AND ARTICLE MANUFACTURING METHOD

BACKGROUND OF THE INVENTION

Field of the Invention

The present invention relates to a measuring method, a measuring apparatus, a lithography apparatus, and an article manufacturing method.

Description of the Related Art

In a lithography apparatus such as an exposure apparatus used in a lithography process, importance is placed on the alignment accuracy between a shot region on a substrate and an original and the overlay accuracy between different layers on the substrate. As a method of measuring a mark formed on a substrate with high accuracy, there is available a method of matching the wavelength of measurement light with the physical or optical characteristics of the mark and its peripheral portion. The physical properties, structures, and shapes of marks on a substrate can vary depending on processes. Accordingly, selecting an optimal wavelength in accordance with a mark makes it possible to maximize the intensity and quality of a detection signal from the mark and implement accurate measurement.

Japanese Patent No. 4792833 discloses that overlay misalignment amounts concerning a plurality of combinations of wavelengths and focus positions are obtained, and a wavelength and a focus position which minimize variations in overlay misalignment amount are set as measurement conditions.

In measuring a mark formed on a substrate, when the parameter value of a measurement parameter differs from an optimal value, the intensity and quality of a detection signal from the mark may decrease, thus leading to a decrease in measurement accuracy.

SUMMARY OF THE INVENTION

The present invention provides a technique advantageous in implementing high measurement accuracy.

A first aspect of the present invention provides a measuring method comprising: performing preliminary measurement, while changing a combination of parameter values of at least two different measurement parameters, concerning each combination; performing processing to obtain a sensitivity distribution as a distribution of sensitivities indicating a change in measurement value with a change in parameter value concerning each of the at least two measurement parameters based on measurement values obtained in the performing preliminary measurement; determining a parameter value to be used concerning each of the at least two measurement parameters based on the sensitivity distribution concerning each of the at least two measurement parameters; and performing main measurement in accordance with the parameter value of each of the at least two measurement parameters determined in the determining.

A second aspect of the present invention provides an article manufacturing method comprising: measuring a position of a mark on a substrate in accordance with a measuring method as defined as the first aspect, and transferring a pattern to the substrate based on the position of the mark; and obtaining an article by processing the substrate to which the pattern is transferred.

A third aspect of the present invention provides a measuring apparatus comprising a measuring unit and a controller, wherein the controller controls the measuring unit to perform preliminary measurement over a plurality of times, while changing a combination of parameter values of at least two different measurement parameters, obtains a sensitivity distribution as a distribution of sensitivities indicating a change in measurement value with a change in parameter value concerning each of the at least two measurement parameters based on measurement values obtained by the preliminary measurement, determines a parameter value to be used concerning each of the at least two measurement parameters based on the sensitivity distribution, and controls the measuring unit to perform main measurement in accordance with the determined parameter value of each of the at least two measurement parameters.

A fourth aspect of the invention provides a lithography apparatus comprising: a measuring apparatus as defined as the third aspect and configured to measure a position of a mark provided on a substrate; and a positioning mechanism configured to position the substrate based on the position of the mark measured by the measuring apparatus, wherein the lithography apparatus is configured to transfer a pattern of the substrate.

A fifth aspect of the present invention provides an article manufacturing method comprising: transferring a pattern to a substrate by using a lithography apparatus as defined as the fourth aspect; and obtaining an article by processing the substrate to which the pattern is transferred.

Further aspects of the present invention will become apparent from the following description of exemplary embodiments with reference to the attached drawings.

BRIEF DESCRIPTION OF THE DRAWINGS

FIGS. 2A to 2C are views for explaining problems;

FIG. 4 is a flowchart for explaining a measurement sequence in the measuring apparatus according to the first embodiment;

FIG. 8 is a flowchart for explaining a measurement sequence in a measuring apparatus according to the second embodiment;

FIGS. 9A and 9B are graphs for explaining specific measurement processing in the measuring apparatus according to the second embodiment;

FIGS. 10A to 10C are views for explaining specific measurement processing in the measuring apparatus according to the second embodiment;

FIGS. 11A to 11C are views for explaining a measurement sequence in a measuring apparatus according to the third embodiment;

FIG. 12 is a flowchart for explaining a measurement sequence in a measuring apparatus according to the fourth embodiment;

FIG. 13 is a view for explaining the arrangement of an exposure apparatus according to the fifth embodiment; and FIG. 14 is a flowchart for explaining a sequence in the exposure apparatus for exposing a substrate.

DESCRIPTION OF THE EMBODIMENTS

Figure 1B:
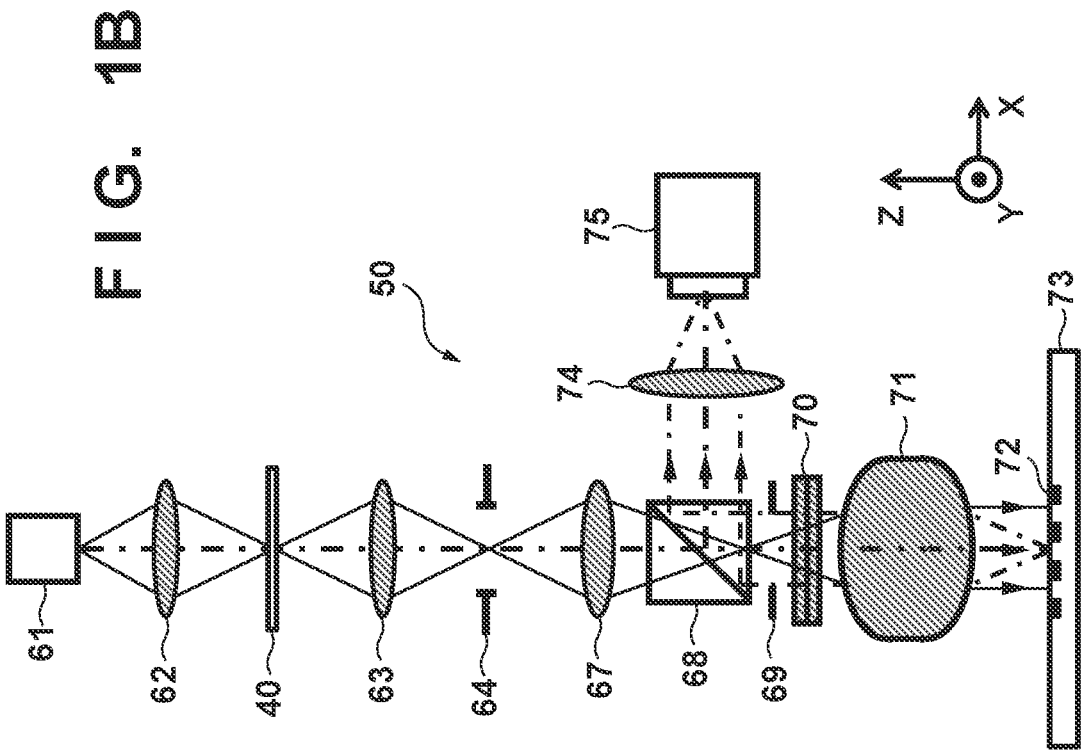
FIGS. 1A and 1B are views showing the arrangement of a measuring apparatus according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1A:
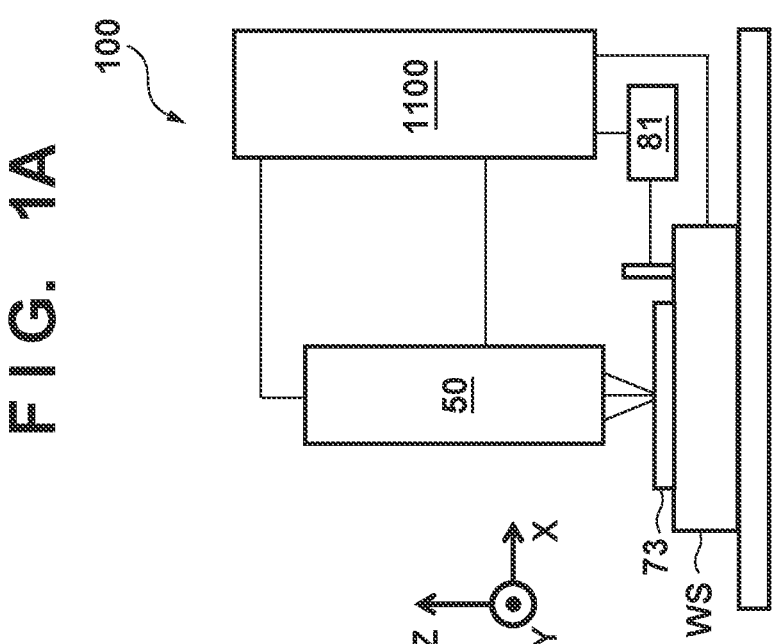

FIG. 1A is a view schematically and exemplarily showing the arrangement of a measuring apparatus 100 according to the first embodiment. The measuring apparatus 100 can be configured as a position detection apparatus that measures or detects the position of a target or measurement object provided on a substrate 73. Alternatively, the measuring apparatus 100 can be configured as an overlay inspection apparatus that measures the relative positions of a plurality of targets provided on different layers on a substrate. As shown in FIG. 1A, the measuring apparatus 100 includes a substrate stage WS that holds the substrate 73, a measuring unit 50, and a controller 1100.

The substrate 73 is a measurement object member whose position or overlay error is measured by the measuring apparatus 100. The substrate 73 can be used to, for example, manufacture a device such as a semiconductor device or a liquid crystal display device. The substrate 73 can be, for example, a wafer or glass substrate. The substrate stage WS holds the substrate 73 via a substrate chuck (not shown) and can be driven or positioned by a substrate driving mechanism (not shown). The substrate driving mechanism includes a linear motor or the like and can drive or position the substrate 73 held by the substrate stage WS by driving the substrate stage WS in the X-axis direction, the Y-axis direction, the Z-axis direction, and the rotation directions around the respective axes. The position of the substrate stage WS is monitored by, for example, a 6-axis laser interferometer 81 or the like, and the substrate stage WS is driven to a predetermined position under the control of the controller 1100. Note that in this specification, directions are expressed by the XYZ coordinate system with a normal to the surface of a measurement object member being the Z-axis direction. The six axes include the X-axis direction, the Y-axis direction, the Z-axis direction, rotation ($\omega$X) around the X axis, rotation ($\omega$Y) around the Y axis, and rotation ($\omega$Z) around the Z axis. The Z-axis direction may be understood as the optical axis direction of the measuring apparatus 100 on the surface of the measurement object member.

The controller 1100 is formed by a computer (information processing apparatus) including a CPU and a memory and, for example, can define the function of the measuring apparatus 100 by comprehensively controlling the constituent elements of the measuring apparatus 100 in accordance with a program stored in a storage unit. The controller 1100 can be configured to control measurement processing in the measuring apparatus 100 and correction processing (calculation processing) of a measurement value obtained by the measuring apparatus 100.

With reference to FIG. 1B, the arrangement of the measuring unit 50 will be described. The measuring unit 50 includes an illumination system for illuminating the substrate 73 using the light from a light source 61 and an imaging system (detection system) for forming light from a measurement pattern (mark) 72 provided on the substrate 73 into an image on a detection unit 75. The detection unit 75 includes a plurality of pixels that detect the light from the measurement pattern 72 and functions as an image capturing unit that forms an image capturing region for capturing the measurement pattern 72 using the plurality of pixels. Here, the measurement pattern 72 as a measurement object or a target can be a pattern for measuring an alignment error or overlay error in the substrate 73. A measurement object or a target may include a plurality of measurement patterns 72. Note that the measurement object is not limited to the measurement pattern provided on a substrate and may be, for example, the stage, its part, a moving object, or its part. In addition, the information obtained by measurement is not limited to position information such as the absolute position or relative position of a measurement object and may be, for example, at least one of the following: the shape, speed, acceleration, and temperature of the measurement object.

Referring to FIG. 1B, light from the light source 61 is guided to a wavelength variable unit 40 via an illumination optical system 62. The light source 61 can be, for example, a laser source, LED, or halogen lamp but is not limited to them. The wavelength variable unit 40 can include, for example, a wavelength variable element and a driving mechanism that drives the wavelength variable element. The driving mechanism includes a linear motor and drives a wavelength variable element 42 along a predetermined direction (for example, the X-axis direction), thereby adjusting the wavelength (for example, the central wavelength and wavelength width) of light illuminating the measurement pattern 72 or target. The position of the wavelength variable element is monitored by using, for example, an encoder or a sensor such as an interferometer and can be positioned to a target position under the control of the controller 1100. Adjusting the position of the wavelength variable element with respect to the optical path of light having a wideband wavelength emitted from the light source 61 by using the driving mechanism can adjust a region where the light enters the wavelength variable element. This causes light having the target wavelength to pass through the wavelength variable element.

Light having passed through the wavelength variable unit 40 or the wavelength variable element is transmitted through an illumination optical system 63 and guided to an illumination aperture stop 64. The light beam diameter at the illumination aperture stop 64 is smaller than the light beam diameter at the light source 61. The light having passed through the illumination aperture stop 64 is guided to a polarization beam splitter 68 via a relay lens 67. The polarization beam splitter 68 transmits P-polarized light and reflects S-polarized light. The P-polarized light transmitted through the polarization beam splitter 68 passes through an aperture stop 69 and a $\lambda$/4 plate 70, is converted into circularly polarized light, and Koehler-illuminates the measurement pattern 72 provided in the substrate 73 via an objective optical system 71.

Note that the illumination optical system 63 may be provided with a light amount adjustment unit (not shown). For example, by providing the light amount adjustment unit capable of selecting a plurality of ND filters having different transmittances with respect to the light from the light source 61, the intensity of light illuminating the substrate 73 can be adjusted.

The light reflected, diffracted, and scattered by the measurement pattern 72 provided in the substrate 73 passes through the $\lambda/4$ plate 70 via the objective optical system 71 is guided to the aperture stop 69 upon conversion from the circularly polarized light to the S-polarized light. Here, the polarization state of the light from the measurement pattern 72 is circular polarization that is reverse to the circular polarization of the light illuminating the measurement pattern 72. Accordingly, when the polarization state of the light illuminating the measurement pattern 72 is clockwise circular polarization, the polarization state of the light from the measurement pattern 72 is counterclockwise circular polarization. The light having passed through the aperture stop 69 is reflected by the polarization beam splitter 68 and is guided to the detection unit 75 via an imaging optical system 74.

In this manner, in the measuring unit 50, the polarization beam splitter 68 separates the optical path of the light illuminating the substrate 73 and the optical path of the light from the substrate 73, and the image of the measurement pattern 72 provided in the substrate 73 is formed in the detection unit 75. Based on the position information of the substrate stage WS obtained by the laser interferometer 81 and the waveform of a detection signal obtained by detecting the image of the measurement pattern 72, the controller 1100 can obtain the position of the pattern element forming the measurement pattern 72 and the position of the measurement pattern 72.

A plurality of lenses and detection aperture stops may be arranged between the polarization beam splitter 68 and the detection unit 75. A plurality of aperture stops which enable setting of different numerical apertures with respect to the illumination system and the detection system may be provided in each of the illumination aperture stop 64 and the detection aperture stop. With this, it is possible to adjust the $\sigma$ value which is a coefficient representing the ratio of the numerical aperture of the illumination system and the numerical aperture of the detection system.

Measurement parameters in the measuring apparatus 100 will be described next. The measuring apparatus 100 can execute measurement preferably in accordance with the set parameter values of at least two parameters. The at least two measurement parameters can include, for example, at least two of the following: the central wavelength, wavelength width, $\sigma$ value, polarization characteristic, and transmittance of light illuminating or detecting a measurement pattern and the position (X, Y, Z) and tilt ($\omega X$, $\omega Y$, $\omega Z$) of the measurement pattern with respect to the measuring unit 50. The polarization characteristic can be a polarization characteristic in an optical path in the measuring apparatus 100 or the measuring unit. The transmittance can be the transmittance of an ND filter arranged in the optical path. The at least two measurement parameters may include various types of arithmetic processing parameters set when the controller calculates measurement values from the image information of a target.

The characteristics of measurement patterns on substrates, for example, the physical properties, structures, shapes, and the like of materials, can vary in accordance with the processes used to obtain the substrates. Accordingly, in order to implement accurate measurement, it is important to match measurement parameters with the characteristics of a measurement pattern. Measurement parameters concerning the wavelength of light used for measurement will be exemplarily described below.

Measurement parameters concerning the wavelength of light used for measurement can include, for example, two measurement parameters, namely a central wavelength and a wavelength width. FIG. 2A is a view showing the wavelength characteristics of light having different central wavelengths. The two different central wavelengths are respectively represented by WL1 and WL2. FIG. 2B is a view showing the wavelength characteristics of light having the same central wavelength but having different wavelength widths. The two different wavelength widths are respectively represented by $\Delta$WL1 and $\Delta$WL2. Setting appropriate central wavelengths and wavelength widths for a measurement pattern formed on a substrate can maximize the intensity and quality of a signal from the measurement pattern and implement accurate measurement.

Before a detailed description of a method of setting measurement parameters according to this embodiment, a method of setting measurement parameters in an overlay inspection apparatus (measuring apparatus) according to a comparative example will be described with reference to FIG. 2C. The overlay inspection apparatus according to the comparative example can obtain measurement data like that shown in FIG. 2C by measuring an overlay error Mij of a measurement pattern concerning each of combinations of pluralities of focus positions Zi and wavelengths WLj. FIG. 2C is a view showing an example of an overlay error M of the measurement pattern obtained concerning each of combinations of the pluralities of focus positions Zi and wavelengths WLj. For example, the position of the measurement pattern obtained under the measurement condition of a wavelength WL1 at a focus position Z1 is represented by M11. Overlay error variations A1 to Aj corresponding to the focus positions and overlay error variations B1 to Bi corresponding to the wavelengths are calculated based on the measurement data shown in FIG. 2C. Specifically, the overlay error variation A1 is calculated from a variation 36 or the range of overlay errors M11 to Mi1 of measurement patterns. The overlay error variation B1 is calculated from the variation 36 or range of the overlay errors M11 to M1$j$ of the measurement patterns. A wavelength corresponding to the minimum variation among the overlay error variations A1 to Aj and a focus position corresponding to the minimum variation among the overlay error variations B1 to Bi are set as measurement parameters based on the above results.

The magnitude relationship between overlay error variations under the respective measurement conditions can depend on both the focus position and the wavelength. Assume that the focus position Z1 and the wavelength WL1 are optimal parameter values. Even in this case, if measurement errors M12 and M21 are large, the overlay error variations A1 and B1 are not minimized. Accordingly, optimal conditions (the focus position Z1 and the wavelength WL1) are not set as parameter values. For this reason, when an overlay error variation under a single measurement condition (for example, only the central wavelength) is used as an evaluation index, it is difficult to accurately determine an optimal parameter value. In addition, when a central wavelength and a wavelength width which determine wavelength characteristics each are not evaluated as a parameter value, the intensity and quality of a detection signal from the measurement pattern are insufficiently optimized, and hence it is difficult to implement high measurement accuracy.

The measuring apparatus 100 according to this embodiment performs preliminary measurement over a plurality of times while changing a combination of the parameter values of a plurality of different measurement parameters. The measuring apparatus 100 then obtains a sensitivity distribution as the distribution of sensitivities indicating changes in measurement value with changes in parameter value for each of a plurality of measurement parameters. The measuring apparatus 100 determines parameter values to be used for each of a plurality of measurement parameters based on the sensitivity distribution and performs main measurement in accordance with the parameter values determined for each of the plurality of measurement parameters. A method of setting the parameter values of measurement parameters in the measuring apparatus according to this embodiment will be described below.

Figure 3A:
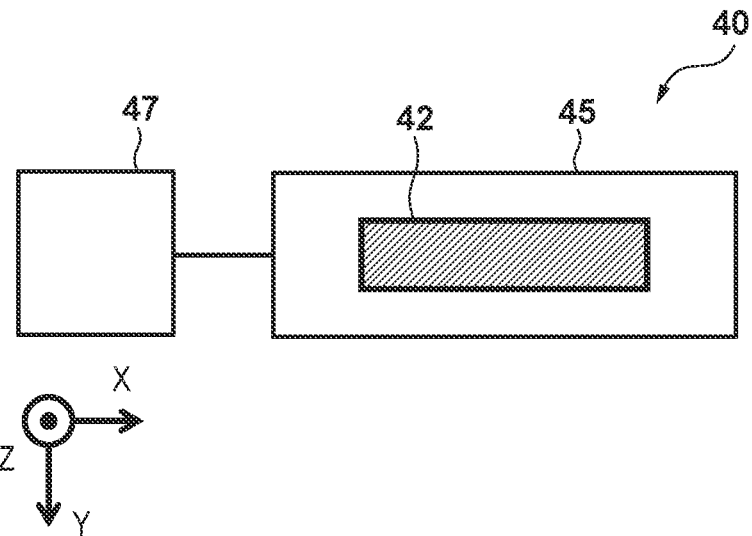
FIGS. 3A and 3B are views for explaining the arrangement and function of a wavelength variable unit in the measuring apparatus according to the first embodiment.

FIG. 3A is a view showing an example of the arrangement of the wavelength variable unit 40. The wavelength variable unit 40 can include the wavelength variable element 42, a holding member 45 that holds the wavelength variable element 42, and a driving mechanism 47 that drives the holding member 45 (the wavelength variable element 42). The driving mechanism 47 can adjust the incident region of light with respect to the wavelength variable element 42 by driving the wavelength variable unit 40 in a predetermined direction (for example, the X direction or rotation around the Z-axis). This converts light having a wideband wavelength emitted from the light source 61 into light having a wavelength corresponding to the incident region of the light with respect to the wavelength variable unit 40, thus illuminating the substrate 73. In other words, based on the light having the wideband wavelength emitted from the light source 61, light having a wavelength corresponding to the incident region of the light with respect to the wavelength variable unit 40 is generated as illumination light, and the substrate 73 is illuminated with the illumination light.

The wavelength variable element 42 may be, for example, a transmission wavelength variable filter or transmission type diffraction grating. This allows the controller 1100 to adjust (change) the wavelength of light transmitted through the wavelength variable element 42 by controlling the position or angle of the wavelength variable element 42 by using the driving mechanism 47. The transmission wavelength variable filter is, for example, a bandpass filter having a multilayer film formed on the surface of a substrate and can be configured to change the thickness of the multilayer film in accordance with the position in the wavelength changing direction. This structure makes it possible to continuously change the wavelength of transmitted light by using light interference.

Figure 3B:
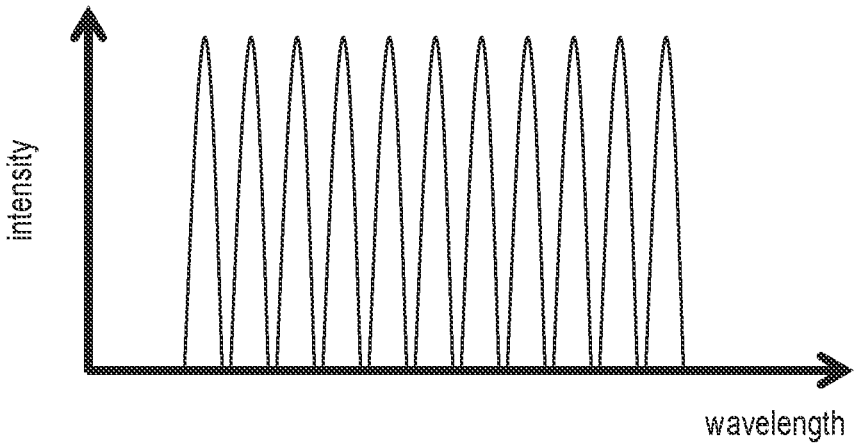

FIG. 3B is a view exemplarily showing the relationship between the wavelength of light transmitted through the wavelength variable element 42 and the signal intensity in a case in which the driving mechanism 47 moves the wavelength variable element 42 to a plurality of positions in a predetermined direction. For example, when the wavelength variable element 42 can be continuously adjusted to positions in the X direction, it is possible to continuously change the central wavelength of light transmitted through the wavelength variable element 42 by adjusting the incident position of light in the X direction with respect to the wavelength variable element 42. In addition, the wavelength variable unit 40 may include a short wavelength cut wavelength variable element 42 and a long wavelength cut wavelength variable element 42 and be configured to individually drive them. With this configuration, controlling the short wavelength cut wavelength variable element 42 and the long wavelength cut wavelength variable element 42 can arbitrarily change both the central wavelength and the wavelength width of transmitted light.

A sequence for measurement processing in the first embodiment will be subsequently described with reference to FIG. 4. In measurement processing, the parameter values of measurement parameters are set, and measurement is performed in accordance with the parameter values. As described above, the controller 1100 performs the measurement processing by comprehensively controlling the constituent elements of the measuring apparatus 100.

When the measurement processing starts, first of all, the processing of matching the relative positions of the substrate 73 and the measuring unit 50 can be executed under the control of the controller 1100 in step S131. Specifically, an image capturing element can be used as the detection unit 75 in the measuring unit 50, and the substrate stage WS holding the substrate 73 can be driven so as to form an image of the measurement pattern 72 in the image capturing region of the image capturing element. The adjustment of the position of the substrate 73 in the Z-axis direction (the optical axis direction or a direction along a light beam) with respect to the measuring unit 50 can be called focus adjustment. In focus adjustment, for example, the signal intensity based on at least one pattern constituting the measurement pattern 72 is obtained, and the substrate stage WS holding the substrate 73 can be positioned so as to make the signal intensity and its change become equal to or more than target values. Alternatively, in focus adjustment, the signal intensities based on a plurality of patterns constituting the measurement pattern 72 may be obtained, and the substrate stage WS holding the substrate 73 may be positioned so as to make both the signal intensity and its change become equal to or more than target values.

In step S132, while a combination of the parameter values of at least two different measurement parameters is changed, an image of the measurement pattern 72 on the substrate 73 can be obtained (imaged) over a plurality of times by using the detection unit 75 under the control of the controller 1100. This processing can be understood as part of a preliminary measurement process of performing preliminary measurement for each combination while changing a combination of the parameter values of a plurality of different measurement parameters. An image of the measurement pattern 72 can be understood as intermediate information for obtaining a measurement value. A plurality of different measurement parameters can include, for example, the central wavelength and the wavelength width which can be controlled by the wavelength variable unit 40. The following will exemplify a case in which a central wavelength and a wavelength width are selected as a plurality of different measurement parameters. However, other measurement parameters may be selected.

Step S133 is a process that can be executed arbitrarily. In step S133, the controller 1100 performs combining processing of generating a composite image by using a plurality of images obtained in step S132. Step S133 can be understood as part of an estimation process of estimating the estimation value obtained for a combination different from the combination having undergone preliminary measurement based on an image as intermediate information obtained in step S132. The combining processing in step S133 will be described in detail later.

In step S134, the controller 1100 performs the first processing of calculating the position (measurement value) of the measurement pattern based on the image obtained in step S132 and the second processing of calculating the position (measurement value) of the measurement pattern based on the composite image generated in step S133. In step S134, the measurement value is not limited to the position information of the measurement pattern and may be the signal intensity information of the measurement pattern or waveform evaluation value information representing the characteristics of a signal waveform. The signal intensity information and waveform evaluation value information of the measurement pattern will be described in detail later. If step S133 is not executed, the second processing in step S134 is not executed either.

In this case, the first processing in steps S132 and S134 can be understood as a preliminary measurement process of performing preliminary measurement concerning a combination of the respective parameter values of a plurality of different measurement parameters. In addition, step S132 can be understood as a detection process of detecting an image as intermediate information for obtaining a measurement value from the measurement object. In addition, the first processing in step S134 can be understood as a calculation process of calculating a measurement value based on the image as the intermediate information.

Furthermore, the second processing in steps S133 and S134 can be understood as an estimation process of estimating a measurement value obtained for a combination different from the combination having undergone preliminary measurement based on the image obtained as the intermediate information obtained in step S132. In this case, in the detection process, an image of the measurement object can be detected as intermediate information. In the estimation process, a composite image is generated from a plurality of images as intermediate information, and a measurement value obtained for a combination different from a combination having undergone preliminary measurement based on the composite image can be estimated.

In step S135, the controller 1100 can calculate, based on the measurement values obtained in step S134, a sensitivity distribution as the distribution of sensitivities indicating changes in the measurement values of a measurement pattern with changes in parameter values concerning at least two measurement parameters. As a sensitivity distribution indicating changes in measurement value with changes in parameter value, for example, it is also acceptable to obtain a sensitivity distribution indicating changes in measurement value with changes in central wavelength and a sensitivity distribution indicating changes in measurement value with changes in wavelength width. A sensitivity distribution includes at least two types of sensitivities respectively corresponding to at least two parameter values. A method of calculating a sensitivity distribution will be described in detail later.

In step S136, the controller 1100 can determine parameter values concerning at least two measurement parameters based on the sensitivity distribution calculated in step S135. This step can be understood as a determination process of determining parameter values to be used concerning the respective measurement parameters based on a sensitivity distribution concerning each of the plurality of measurement parameters. This determination process makes it possible to determine an optimal central wavelength and an optimal wavelength width (their combination).

In step S137, the detection unit 75 can obtain the image information of the measurement pattern 72 in accordance with each of the parameter values of the plurality of measurement parameters determined in step S136 under the control of the controller 1100, and the position of the measurement pattern 72 can be measured based on the image information. This step can be understood as a main measurement process of performing main measurement in accordance with the parameter values of the respective measurement parameters determined in step S135 (the determination process).

Figure 5:
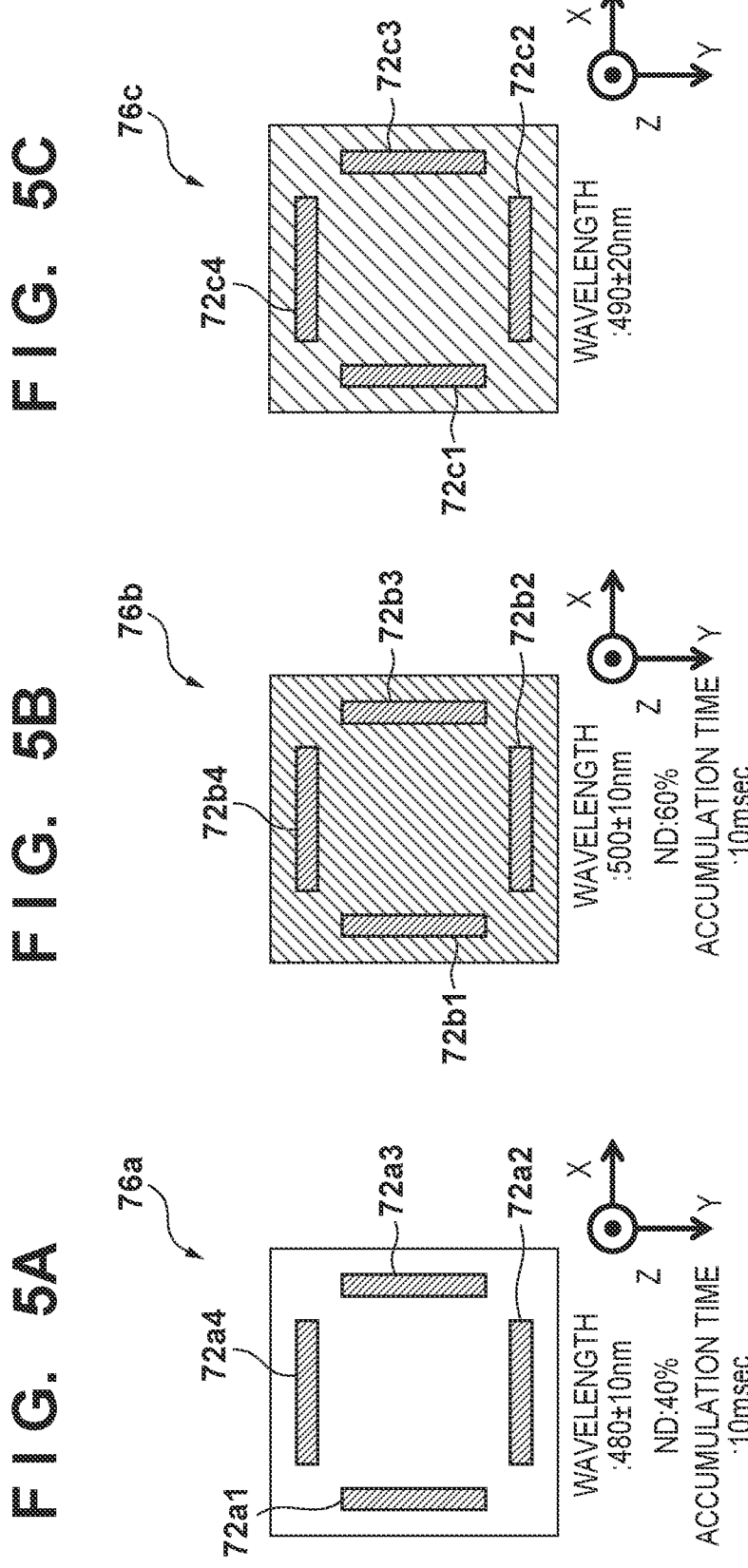
FIGS. 5A to 5C are views for explaining specific measurement processing in the measuring apparatus according to the first embodiment.

A combining processing method for a plurality of images in step S133 will be described below with reference to FIGS. 5A to 5C. The following is a description of a method of setting two measurement parameters, specifically a central wavelength and a wavelength width. FIG. 5A shows an image 76a including measurement patterns 72a1, 72a2, 72a3, 72a4 obtained by the detection unit 75 under the condition of a central wavelength of 480 nm and a wavelength width of ±10 nm. FIG. 5B shows an image 76b obtained by the detection unit 75 under the condition of a central wavelength of 500 nm and a wavelength width of ±10 nm. The image 76a and the image 76b respectively shown in FIGS. 5A and 5B schematically show the images respectively obtained with ND filter transmittances of 40% and 60% and an accumulation time of 10 msec in the detection unit 75. The images 76a and 76b exhibit characteristics that the pattern portions and non-pattern portions respectively have different signal intensities due to differences in parameter value.

FIG. 5C shows a composite image 76c obtained by performing combining processing of the images 76a and 76b based on a reference luminance. In this case, the reference luminance means the luminance as a reference calculated from a measurement condition (parameter value) concerning a light amount and set at the time of detection of each image and is obtained for the purpose of matching the luminances of a plurality of images at the time of combining processing. Letting Ta and Tb be ND filter transmittances and Ca and Cb be accumulation times at the time of detection of the two images 76a and 76b used for combining processing, luminances Sa and Sb of the images 76a and 76b can be represented by equations (1) and (2) given below.

$$Sa=1/(Ca \times Ta) \tag{1}$$

$$Sb=1/(Cb \times Tb) \tag{2}$$

If Ta<Tb and Ca<Cb, the high luminance Sa is the reference luminance, and the ratio of the luminance Sb to the reference luminance Sa is obtained as 0.67 by equations (1) and (2) and the measurement conditions shown in FIG. 5B. The composite image 76c including measurement patterns 72c1, 72c2, 72c3, 72c4 corresponding to the image detected under the condition of a central wavelength of 490 nm and a wavelength width of ±20 nm can be generated by generating an image by multiplying the pixel outputs of the image 76b by the ratio of the luminance to the reference luminance and combining the generated image with the image 76a with the reference luminance. This makes it possible to shorten the time required to determine an optimal central wavelength and an optimal wavelength width as compared with the case in which images are obtained concerning all combinations of a plurality of required central wavelengths and a plurality of required wavelength widths.

Assume that two images used for combining processing are combined without matching the reference values of the detection amounts of light of the two images. In this case, the actually obtained image and the image formed by combining processing differ in the signal intensities of pattern portions and non-pattern portions. Accordingly, it is difficult to accurately obtain a combination of an optimal central wavelength and an optimal wavelength width. For this reason, in step S133, it is preferable to perform combining processing upon matching the reference values of the detection amounts of light of the two images. This makes it possible to accurately determine a combination of an optimal central wavelength and an optimal wavelength width. Although the method of calculating luminances by using ND filter transmittances and accumulation times according to equations (1) and (2) has been described above, the present invention is not limited to this method. For example, a current value for controlling the output of the light source 61 and a gain set for the detection unit 75 may be set.

A method of calculating the position information of a measurement pattern in step S134 will be described next. The position of the measurement pattern 72 can be calculated by processing the image of the measurement pattern 72 obtained in step S133 using, for example, a template matching method. The template matching method can detect a position where the highest correlation appears as the central position of the measurement pattern by calculating the correlation between the signal obtained in step S133 and the model signal (template) obtained in advance. Obtaining the center of gravity pixel position of a region having several pixels on the left and right sides from the position of a peak of a correlation value function makes it possible to implement a resolution of $1/10$ pixel to $1/50$ pixel.

A method of calculating a sensitivity distribution in step S135 will be described below with reference to FIGS. 6A and 6B. As an example of a sensitivity distribution, a sensitivity distribution indicating changes in measurement value with respect to changes in central wavelength (in brief, a sensitivity distribution with respect to changes in central wavelength) will be exemplarily described. A sensitivity distribution with respect to changes in central wavelength is an aggregation of sensitivities indicating changes in measurement value with respect to changes in central wavelength and includes at least two sensitivities. A sensitivity distribution with respect to changes in central wavelength is an index for determining the value of a central wavelength as a measurement parameter used for measurement in step S136.

Figure 6:
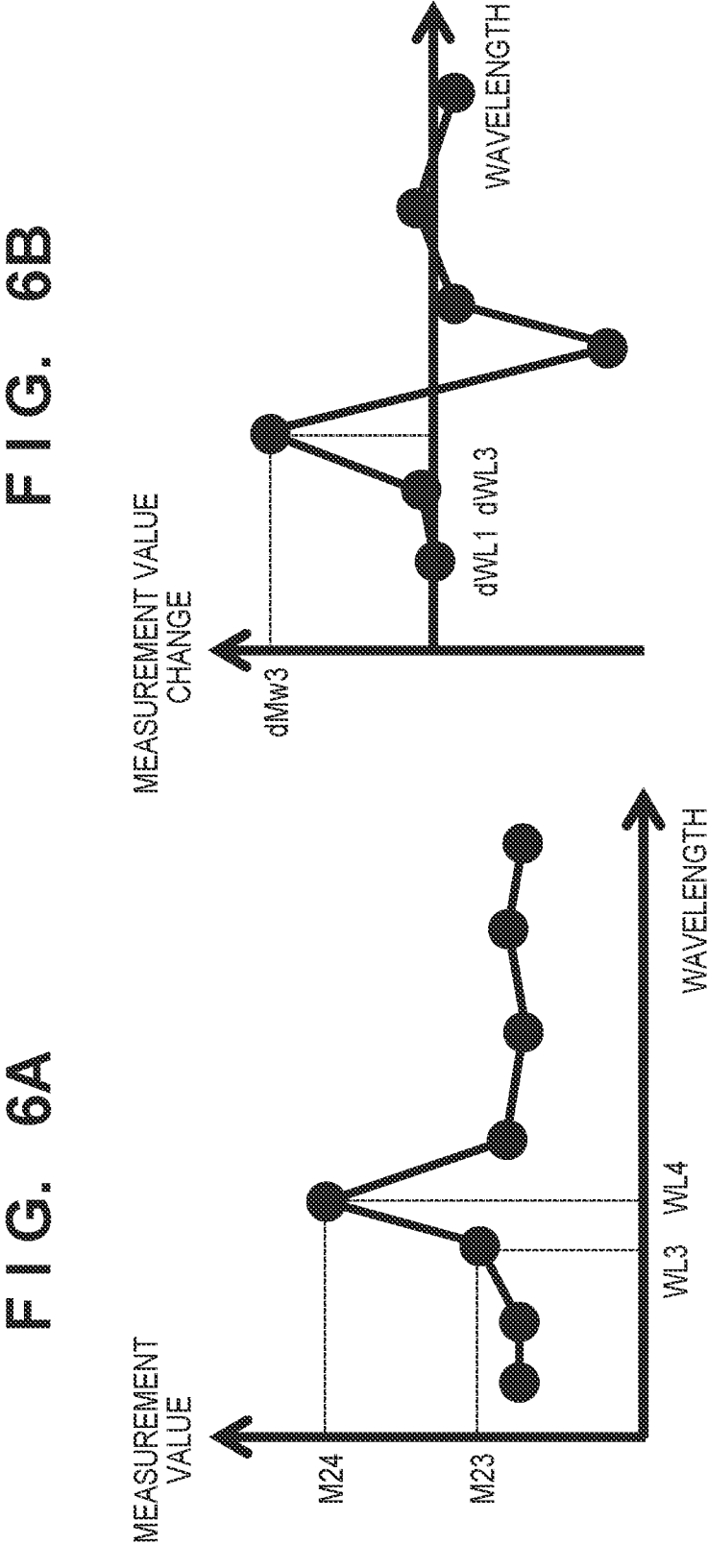
FIGS. 6A and 6B are graphs for explaining specific measurement processing in the measuring apparatus according to the first embodiment.

FIG. 6A is a graph showing the relationship between the position information (measurement value) of the measurement pattern and the central wavelength. The abscissa represents the central wavelength (written as "wavelength"), and the ordinate represents the position information of the measurement pattern (written as "measurement value"). Central wavelengths WL3 and WL4 mean the central wavelengths of light. Let M23 be the measurement value obtained by measuring the position of the measurement pattern 72 with light having the central wavelength WL3 and M24 be the measurement value obtained by measuring the position of the measurement pattern 72 with light having the central wavelength WL4 while the surface of the substrate 73 is aligned with the best focus position of the measuring unit 50. FIG. 6B is a graph showing a wavelength sensitivity distribution indicating changes in the measurement value of the measurement pattern 72 with respect to changes in central wavelength. The abscissa represents the central wavelength, and the ordinate represents changes in measurement value calculated from the measurement values shown in FIG. 6A. For example, a central wavelength dWL3 and a measurement value change dMw3 are respectively represented by equations (3) and (4).

$$dWL3=(WL3+WL4)\div 2 \tag{3}$$

$$dMw3=(M24-M23)\div(WL4-WL3) \tag{4}$$

A method of determining the parameter values of measurement parameters in step S136 (determination process) will be described next. In step S136, the parameter values to be used are determined based on the sensitivity distribution calculated in step S135. As a determination criterion in step S136, a parameter value indicating a low sensitivity is preferably selected. From another point of view, in step S136 (determination process), it is preferable to determine a parameter value to be used so as to make the sensitivity in the sensitivity distribution become worse than a predetermined sensitivity in the parameter value to be used. From still another point of view, in step S136 (determination process), it is preferable to determine a parameter value to be used so as to make the sensitivity in the sensitivity distribution become lower than a predetermined sensitivity in the parameter value to be used. From still another point of view, in step S136 (determination process), it is preferable to determine a parameter value to be used so as to make the sensitivity in the sensitivity distribution become a minimum in the parameter value to be used.

Figure 7:
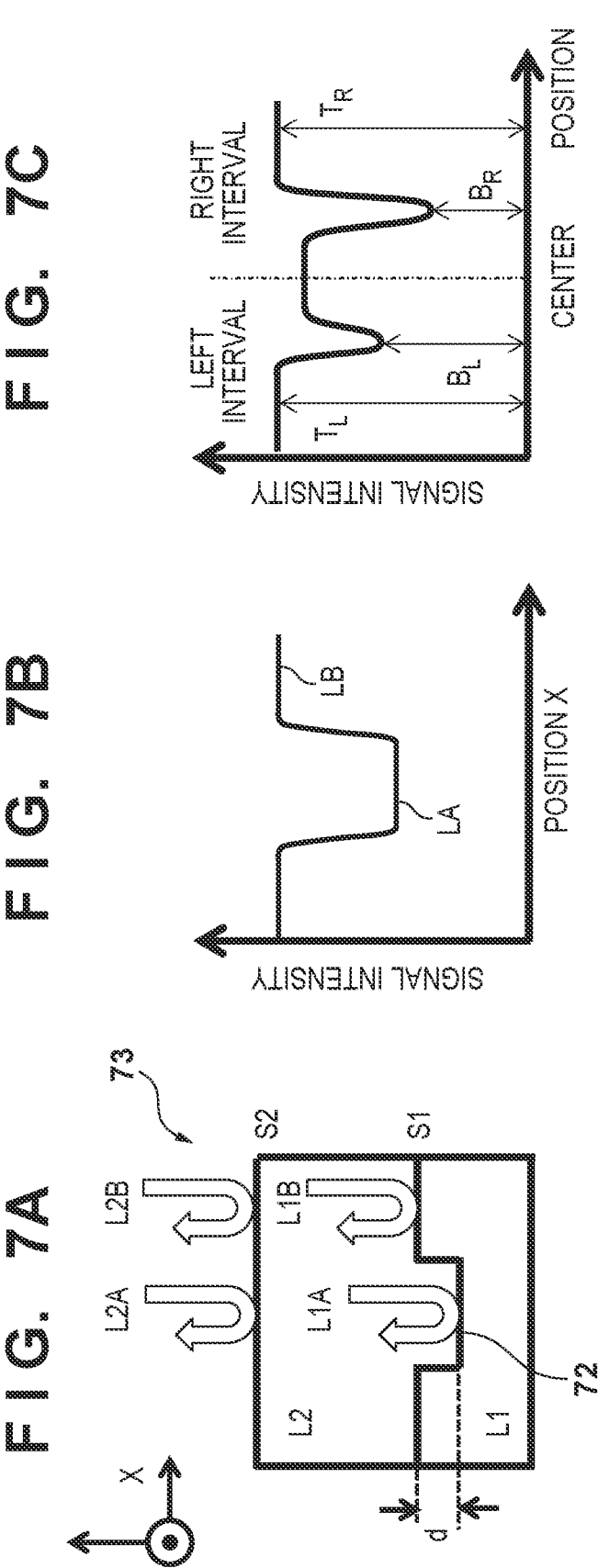
FIGS. 7A to 7C are graphs for explaining specific measurement processing in the measuring apparatus according to the first embodiment.

The above reason about the determination of parameter values will be described below with reference to FIGS. 7A to 7C. FIG. 7A is a graph exemplarily showing reflected light from the measurement pattern 72 and the non-pattern portion on a section of the substrate 73. The substrate 73 is constituted by a first layer L1 and a second layer L2 and has two boundary surfaces S1 and S2. On the boundary surface S1, the measurement pattern 72 has a step difference of a height d with respect to the non-pattern portion. Let L1A be reflected light from the measurement pattern 72 on the first boundary surface S1, L1B be reflected light from the non-pattern portion, and L2A and L2B be reflected light from the measurement pattern 72 and the non-pattern portion on the boundary surface S2. In the measuring unit 50, interference light between the reflected light L1A and the reflected light L2A and interference light between the reflected light L1B and the reflected light L2B respectively become reflected light LA from the measurement pattern 72 and reflected light LB from the non-pattern portion, each of which is detected.

FIG. 7B is a graph showing an example of signal intensity information corresponding to a position X and including the reflected light LA from the pattern portion and the reflected light LB from the non-pattern portion shown in FIG. 7A. In this case, as the signal intensity difference between the reflected light LA and the reflected light LB decreases, the signal contrast decreases, thus making it more difficult to detect the position of the measurement pattern. The signal intensity difference between the reflected light LA and the reflected light LB changes in accordance with a phase difference $\Delta$ originating from the step difference d of the measurement pattern 72, and the phase difference $\Delta$ is represented by equation (5) given below by using a refractive index n of the second layer L2, the step difference d, and a wavelength $\lambda$.

$$\Delta=2nd\times 2\pi/\lambda \tag{5}$$

According to equation (5), if the measurement pattern 72 varies in the refractive index n of the second layer L2 or the step difference d, the phase difference $\Delta$ changes. As described above, a change in the phase difference $\Delta$ causes a change in signal contrast. Along with this change, a measurement error may occur to lead to a decrease in measurement accuracy.

In this case, as indicated by equation (5), since a change in central wavelength corresponds to a variation in the phase difference $\Delta$, sensitivity indicating a change in measurement value with a change in central wavelength corresponds to a measurement value variation with respect to a phase difference variation. Accordingly, in step S136 in this embodiment, selecting a parameter value representing a low sensitivity indicating a change in measurement value with respect to a change in central wavelength can reduce the measurement error accompanying a process change.

FIG. 7C is a graph showing an example of signal intensity information. In this case, waveform evaluation value information means an index indicating the quality of the signal waveform generated based on an output from the detection unit 75. An example of waveform evaluation value information is a value obtained by quantifying the asymmetry of the signal waveform of a measurement pattern. For example, referring to FIG. 7A, let TL and BL respectively be the maximum and minimum values of signal intensity in the left interval of the signal waveform, TR and BR respectively be the maximum and minimum values of the signal intensity in the right interval, and ML and MR respectively be signal intensities of the central portion of the signal waveform. As indicated by equation (6) given below, asymmetry ES between the left interval and the right interval of the signal waveform may be obtained as a measurement value in step S134.

$$ES=(TL-BL)/(TL+BL)-(TR-BR)/(TR+BR) \qquad (6)$$

A method of calculating asymmetry is not limited to equation (6). For example, the central position of the signal waveform may be defined, and the asymmetry of the signal waveform may be defined based on the signal intensities in predetermined position ranges in the left and right intervals relative to the central position. In addition, waveform evaluation value information is not limited to asymmetry, and the contrast of the measurement pattern may be evaluated as indicated by equation (7) given below.

$$EC=\{(TL-BL)/(TL+BL)+(TR-BR)/(TR+BR)\}/2 \qquad (7)$$

As described above, waveform evaluation value information may be obtained as a measurement value instead of the position information of the measurement pattern, and the parameter value of the measurement parameter may be determined based on the signal intensity information of the measurement pattern or the sensitivity of the waveform evaluation value information.

As described above, in the first embodiment, a sensitivity distribution is obtained concerning each of a plurality of measurement parameters, and a parameter value to be used is determined concerning each of the plurality of measurement parameters based on the sensitivity distribution. This makes it possible to measure a measurement object fast and accurately.

A measuring apparatus and measurement processing according to the second embodiment will be described below with reference to FIG. 8. The second embodiment differs from the first embodiment in the method of calculating sensitivity for setting the parameter value of a measurement parameter but is the same as the first embodiment in other configurations. Matters that are not mentioned here can comply with the first embodiment.

FIG. 8 is a flowchart showing a sequence for measurement processing in the second embodiment. As in the first embodiment, a controller 1100 shown in FIG. 1A performs this measurement processing by comprehensively controlling the constituent elements of a measuring apparatus 100. When the measurement processing starts, first of all, the processing of matching the relative positions of a substrate 73 and a measuring unit 50 can be executed under the control of the controller 1100 in step S231. In step S232, while a combination of the parameter values of at least two different measurement parameters is changed, an image of a measurement pattern 72 provided on the substrate 73 can be obtained (captured) over a plurality of times by using a detection unit 75 under the control of the controller 1100. This processing can be understood as part of a preliminary measurement process of performing preliminary measurement for each combination while changing a combination of the parameter values of a plurality of different measurement parameters. The plurality of different measurement parameters can include, for example, the central wavelength and the wavelength width that can be controlled by a wavelength variable unit 40. The following is a description of a case in which a central wavelength and a wavelength width are selected as a plurality of different measurement parameters. In the second embodiment, consideration is given to the sensitivity of a measurement value with respect to the shift (defocus) of the surface of the substrate 73 from the best focus position of the measuring unit 50. Step S232 includes the operation of driving a substrate stage WS holding the substrate 73 by a predetermined amount in the Z direction, and an image of a measurement pattern 72 can be obtained (captured) by a detection unit 75 at each of different positions in the Z direction.

Step S233 is a process that can be arbitrarily executed. In step S233, the controller 1100 performs combining processing of generating a composite image by using a plurality of pieces of image information obtained in step S232. In step S234, the controller 1100 performs the first processing of calculating the position (measurement value) of the measurement pattern based on the image obtained in step S232 and the second process of calculating the position (measurement value) of the measurement pattern based on the composite image generated in step S233.

The first processing in steps S232 and S234 can be understood as a preliminary measurement process of performing preliminary measurement concerning a combination of the parameter values of a plurality of different measurement parameters. Step S232 can be understood as a detection process of detecting an image as intermediate information for obtaining a measurement value from the measurement object. The first processing in step S234 can be understood as a calculation process of calculating a measurement value based on the image as the intermediate information.

The second processing in steps S233 and S234 can be understood as an estimation process of estimating a measurement value obtained for a combination different from the combination having undergone preliminary measurement based on the image as the intermediate information obtained in step S232. In this case, in the detection process, an image of the measurement object can be detected as intermediate information. In the estimation process, a composite image can be generated from a plurality of images as intermediate information, and a measurement value obtained for a combination different from the combination having undergone preliminary measurement can be estimated based on the composite image.

In step S235, the controller 1100 can calculate a sensitivity distribution as the distribution of sensitivities indicating changes in the measurement values of the measurement patterns with changes in parameter value concerning at least two measurement parameters based on the measurement values obtained in step S234. As a sensitivity distribution indicating changes in measurement value with changes in parameter value, for example, a sensitivity distribution indicating changes in measurement value with changes in central wavelength and a sensitivity distribution indicating changes in measurement value with changes in wavelength width may be obtained. A sensitivity distribution includes at least two sensitivities respectively corresponding to at least two measurement parameters. A method of calculating a sensitivity distribution will be described in detail later.

In step S236, the controller 1100 can determine parameter values for at least two measurement parameters based on the sensitivity distribution calculated in step S235. This step can be understood as a determination process of determining parameter values to be used for the respective measurement parameters based on the sensitivity distribution concerning each of the plurality of measurement parameters. This determination process makes it possible to determine an optimal central wavelength and an optimal wavelength width (their combination).

In step S237, the detection unit 75 can obtain the image information of the measurement pattern 72 in accordance with each of the parameter values of the plurality of measurement parameters determined in step S236 under the control of the controller 1100, and the position of the measurement pattern 72 can be measured based on the image information. This step can be understood as a main measurement process of performing main measurement in accordance with the parameter values of the respective measurement parameters determined in step S235 (the determination process).

In the second embodiment, a sensitivity to changes in the parameter value of a measurement parameter with respect to changes in measurement value (focus sensitivity) with changes in focus state (changes in defocus) can be used to determine the parameter value. For example, a sensitivity to changes in central wavelength (in brief, a focus sensitivity to changes in central wavelength) with respect to changes in measurement value (focus sensitivity) with changes in focus state (changes in defocus) can be used to determine a parameter value. In addition, a sensitivity to changes in wavelength width (in brief, a focus sensitivity to changes in wavelength width) with respect to changes in measurement value (focus sensitivity) with changes in focus state (changes in defocus) can be used to determine a parameter value. If a relative angle shift occurs between a normal to the surface of the substrate 73 and the optical axis of the measuring unit 50, the measurement value changes accompanying relative focus position variations of the substrate 73 and the measuring unit 50. Accordingly, selecting parameter values representing low focus sensitivities concerning at least two measurement parameters (in this case, a central wavelength and a wavelength width) can reduce variations in measurement value and implement accurate measurement.

In step S232, for example, an image of a measurement pattern can be obtained with respect to each of different positions in the Z-axis direction. In step S234, the positions (measurement values) of the measurement patterns can be calculated with respect to the image information obtained in step S232 and the composite image generated in step S233. Like FIG. 6A, FIG. 9A is a graph showing the relationship between the positions (measurement values) of the measurement patterns and the central wavelengths. The abscissa represents the central wavelength, and the ordinate represents the measurement value. Wavelengths WL3 and WL4 mean the central wavelengths of light illuminating the substrate and light detected from the substrate. In the case shown in FIG. 9A, as in FIG. 6A, changes in measurement value with changes in central wavelength are obtained while the substrate 73 is aligned with the best focus position of the measuring unit 50 and the substrate 73 is also aligned with a defocus position. For example, let M14 and M24 be the measurement values of the measurement pattern 72 with light having the central wavelength WL4 at a best focus position Z1 and a defocus position Z2. Likewise, let M16 and M26 be the measurement values of the measurement pattern 72 with light having the central wavelength WL6.

In step S235, with respect to at least two measurement parameters, sensitivities indicating changes in the measurement values of the measurement patterns with changes in the parameter values of the measurement parameters are calculated. In this case, consideration is given to, for example, changes in central wavelength and wavelength width as changes in parameter value. In addition, consideration is given to changes in focus sensitivity as changes in measurement value.

FIG. 9B is a graph showing the relationship between central wavelengths and changes in measurement value (focus sensitivity) of the measurement pattern 72 with changes in focus state. The abscissa represents the central wavelength, and the ordinate represents the measurement value changes calculated from the measurement values shown in FIG. 9A. Measurement value changes dMz4 and dMz6 are respectively represented by equations (8) and (9) given below.

$$dMz4 = M14 - M24 \tag{8}$$

$$dMz6 = M16 - M26 \tag{9}$$

In step S236, the controller 1100 can respectively determine parameter values for at least two measurement parameters based on the sensitivity distribution calculated in step S235. Selecting parameter values representing low focus sensitivities concerning the respective measurement parameters can minimize, for example, changes in measurement value due to variations in parameter value, thereby implementing accurate measurement.

The parameter value of each measurement parameter can be determined by using a method of determination based on a plurality of indices instead of the above method of determination based on one index. For example, it is also acceptable to determine a parameter value based on both indices, namely the sensitivity distribution with respect to changes in central wavelength in the first embodiment and the focus sensitivity with respect to changes in central wavelength in the second embodiment. In determining a parameter value based on a plurality of indices (sensitivities), a weighting function may be set to adjust the relative influences of the respective sensitivities. For example, the above two sensitivities may be weighted in consideration of the difference in influence degree between wavelength changes in process variations and focus changes. This makes it possible to suppress measurement value changes (measurement errors) with respect to wavelength changes and focus changes accompanying process variations.

The above is a description of the calculation of a sensitivity by using the single measurement pattern 72 on the substrate 73. However, a sensitivity may be calculated by using the measurement patterns 72 formed at different positions. For example, as shown in FIG. 10A, a wavelength sensitivity and a focus sensitivity may be obtained by detecting images of a plurality of measurement patterns 72a1, 72a2, 72a3, 72a4 and 72b1, 72b2, 72b3, 72b4 formed on the substrate 73 and calculating measurement values based on the obtained image information. As shown in FIG. 10B, sensitivities Sa and Sb corresponding to the measurement patterns 72a1, 72a2, 72a3, 72a4 and 72b1, 72b2, 72b3, 72b4 may be obtained.

In determining the parameter values of measurement parameters from two or more parameter value candidates, it is preferable to determine measurement parameters based on the average value or variations of the sensitivities Sa and Sb at the same wavelength so as to minimize the errors caused when a plurality of measurement parameters on the substrate are measured. With this operation, it is also acceptable to minimize, for example, measurement errors corresponding to positions on the substrate 73 due to the thickness variations of the substrate 73.

It is also acceptable to weight each of measurement parameters such as the wavelength, σ value, and polarization of light used by the measuring unit 50. For example, after a wavelength sensitivity distribution is calculated based on obtained measurement values, the sensitivity distribution shown in FIG. 10B can be integrated with a weighting function W1 for each wavelength like that shown in FIG. 10C. Specific examples of weighting include a change in signal contrast in accordance with the wavelength of the measurement pattern 72 and a measurement accuracy or measurement time difference accompanying a σ value difference. This makes it possible to suppress a decrease in measurement accuracy or an increase in measurement time by calculating a sensitivity upon adding a predetermined weight to the measurement value obtained concerning the measurement pattern 72.

A measuring apparatus according to the third embodiment will be described below. Matters that are not mentioned here can comply with the first embodiment. An overlay measuring apparatus (overlay inspection apparatus) that measures the relative positions of a plurality of measurement patterns formed on different layers on a substrate 73 will be described with reference to FIGS. 11A to 11C.

Figures 11A, 11B:
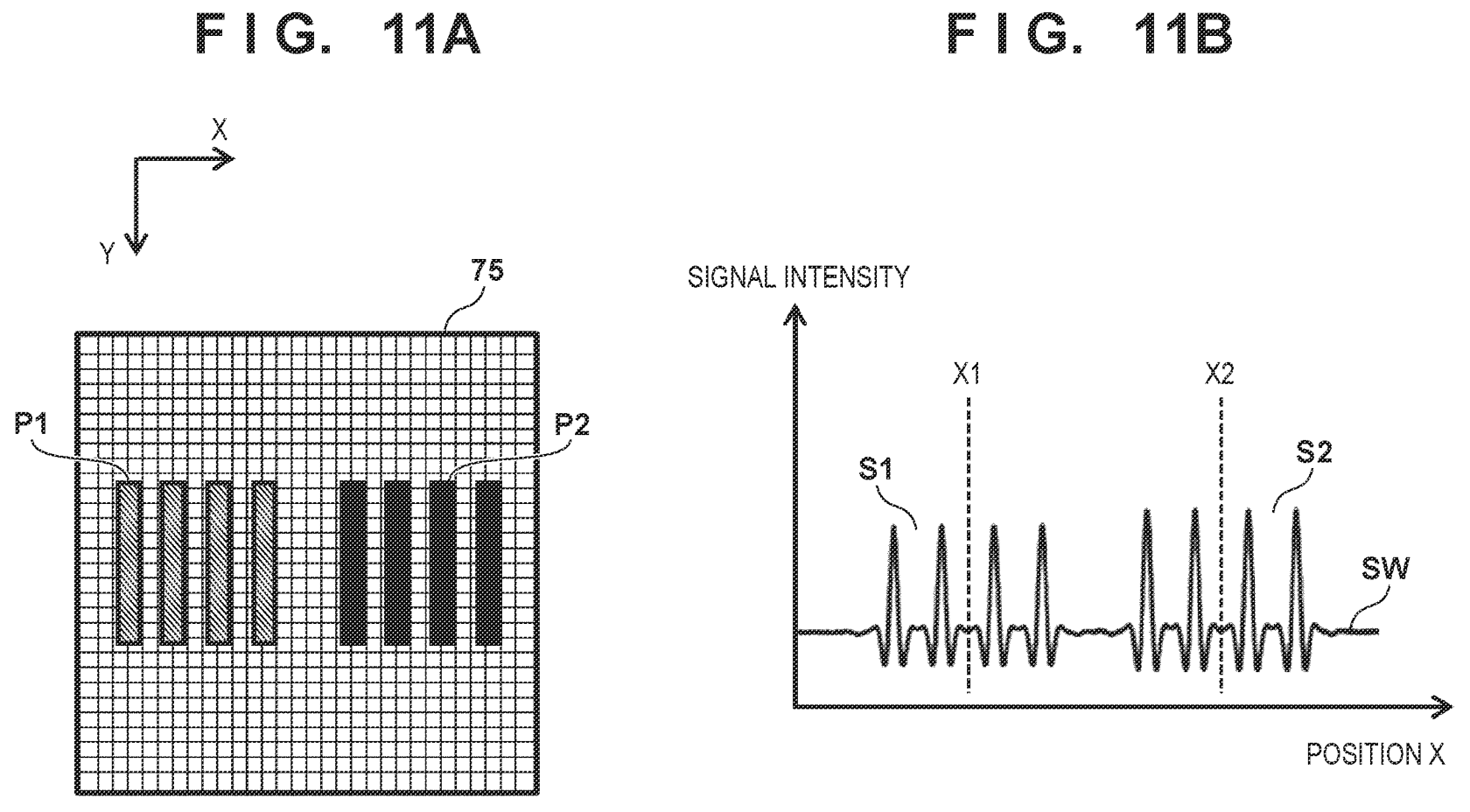

FIG. 11A is a view exemplarily showing an image of a measurement pattern 72 formed on the detection surface of a detection unit 75 shown in FIG. 1B. The measurement pattern 72 can include a first pattern group P1 and a second pattern group P2 respectively formed on different layers. The detection unit 75 can include a two-dimensional image capturing element having a plurality of pixels in the X and Y directions. A controller 1100 can generate signal waveforms respectively representing the first pattern group P1 and the second pattern group P2 based on outputs from the detection unit 75.

FIG. 11B shows a signal waveform SW generated by integrating the signal intensities of patterns on the respective pixels of the detection unit 75 in the Y direction in FIG. 11A as an example of the signal waveform generated based on outputs from the detection unit 75 shown in FIG. 11A. In integrating the signal intensities on the respective pixels of the detection unit 75, the number of pixels to be integrated is preferably set based on the dimension information of the patterns. A waveform S1 and a waveform S2 shown in FIG. 11B mean changes in the signal intensities of the first pattern group P1 and the second pattern group P2 in the signal waveform SW. In addition, a measurement value X1 and a measurement value X2 respectively correspond to the central positions of the first pattern group P1 and the second pattern group P2 respectively calculated based by the controller 1100 on the waveform S1 and the waveform S2. For example, calculating the difference between the measurement value X1 and the measurement value X2 will calculate the relative position shift between the first pattern group P1 and the second pattern group P2 in the X direction. In calculating a relative position shift in the Y direction, it is possible to use the first and second pattern groups constituted by a plurality of patterns formed on a substrate along the Y direction, with the longitudinal direction of each pattern coinciding with the X direction. Signal waveforms are then generated by integrating the signal intensities of the patterns on the respective pixels in the X direction, and a relative position shift is calculated from the measurement value differences between the respective pattern groups like the relative position shift in the X direction.

FIG. 11C is a flowchart showing a sequence for measurement processing of determining measurement parameters. The controller 1100 shown in FIG. 1A performs the measurement processing by comprehensively controlling the constituent elements of the measuring apparatus 100. When the measurement processing starts, first of all, the processing of matching the relative positions of the substrate 73 and a measuring unit 50 is executed in step S331. In this case, as shown in FIG. 11A, both the first pattern group P1 and the second pattern group P2 are aligned with the detection unit 75. In step S332, while a combination of the parameter values of at least two different measurement parameters is changed, the detection unit 75 can obtain images of the first pattern group P1 and the second pattern group P2 provided on the substrate 73 over a plurality of times. This processing can be performed in the same manner as in step S132 or S232. In step S333, the controller 1100 performs combining processing of generating a composite image by using a plurality of pieces of image information obtained in step S332. In step S334, the controller 1100 calculates the positions (measurement values) of the first pattern group P1 and the second pattern group P2 concerning the image information obtained in step S332 and the composite image generated in step S333. In step S335, the controller 1100 calculates the sensitivities of the measurement values of the first pattern group P1 and the second pattern group P2 to changes in parameter value concerning the at least two measurement parameters.

In step S336, the controller 1100 determines parameter values concerning the at least two measurement parameters based on the sensitivity distribution calculated in step S335. In step S337, the detection unit 75 obtains the image information of the first pattern group P1 and the second pattern group P2 in accordance with the parameter values of the plurality of measurement parameters determined in step S336 under the control of the controller 1100. The positions of the first pattern group P1 and the second pattern group P2 can be measured based on the image information.

A method of measuring the positions of the first pattern group P1 and the second pattern group P2 formed on different layers on the substrate 73 will be exemplarily described. There are two methods of aligning the substrate 73 with the measuring unit 50. In the first method, the first pattern group P1 and the second pattern group P2 each are individually aligned with the best focus position of the measuring unit 50, and the positions of the first pattern group P1 and the second pattern group P2 each are measured. In the second method, while the substrate 73 and the detection unit 75 are aligned with a given focus position, the positions of the first pattern group P1 and the second pattern group P2 can be measured.

In using the first method, in step S335, a sensitivity distribution is obtained according to the first embodiment, the second embodiment, or the like with reference to the best focus positions of the first pattern group P1 and the second pattern group P2. In using the second method, in step S335, a sensitivity distribution can be obtained according to the first embodiment, the second embodiment, or the like with reference to a common focus position. The common focus position can be determined based on the intensity and quality of a detection signal from each of the first and second pattern groups P1 and P2.

As described above, in the third embodiment, the positions of a plurality of measurement parameters formed on different layers of the substrate 73 are measured while a combination of the parameter values of at least two different measurement parameters is changed. A sensitivity distribution is then calculated based on the measurement values obtained by this operation. The parameter values of the at least two measurement parameters are then determined based on the sensitivity distribution. This makes it possible to reduce errors in overlay measurement and implement accurate overlay by selecting parameter values with small changes in measurement value with changes in parameter value such as changes in wavelength or focus. In this embodiment, this makes it possible to provide an overlay inspection apparatus that can fast and accurately measure overlay errors of patterns on a substrate.

A measuring apparatus (measurement pattern monitor) that measures changes in the characteristics of measurement patterns formed on a substrate according to the fourth embodiment will be described below. Matters that are not mentioned here can comply with the first embodiment. As the fourth embodiment, a measuring apparatus and measurement processing according to the fourth embodiment will be described with reference to FIG. 12. The fourth embodiment differs from the first embodiment in the method of determining the parameter values of measurement parameters.

The measuring apparatus (measurement pattern monitor) that measures changes in the characteristics of measurement patterns will be described first. Assume that in a processing step such as heating of a substrate or film formation, the substrate has deformed or changed in structure/characteristics. In this case, as the signal intensity information of obtained measurement patterns changes, the alignment accuracy of the substrate or the overlay accuracy of patterns on the substrate deteriorates. Accordingly, the presence/absence of an abnormality in each processing step is detected by measuring (monitoring) the characteristics of measurement patterns by using the measuring apparatus, thereby specifying a processing apparatus as a cause of changes in the characteristics of the measurement patterns. Accordingly, changing the calibration or set conditions of the processing apparatus or re-examining the structures of measurement patterns or a processing step can reduce the occurrence of defective products accompanying a deterioration in the alignment accuracy of the substrate or a deterioration in the overlay accuracy of patterns.

FIG. 12 is a flowchart showing a sequence for measurement processing according to the fourth embodiment. Steps S431 to S435 are the same as steps S131 to S135 shown in FIG. 4, and hence a description thereof will be omitted.

A method of determining the parameter values of measurement parameters in step S436 (determination process) will be described next. In step S436, parameter values to be used are determined based on the sensitivity distribution calculated in step S435. As a determination criterion in step S436, a parameter value indicating a high sensitivity is preferably selected. From another point of view, in step S436 (determination process), it is preferable to determine a parameter value to be used so as to make the sensitivity in the sensitivity distribution become more sensitive than a predetermined sensitivity in the parameter value to be used. From still another point of view, in step S436 (determination process), it is preferable to determine a parameter value to be used so as to make the sensitivity in the sensitivity distribution become higher than a predetermined sensitivity in the parameter value to be used. From still another point of view, in step S436 (determination process), it is preferable to determine a parameter value to be used so as to make the sensitivity in the sensitivity distribution become a maximum in the parameter value to be used.

Note that in executing measurement processing concerning a plurality of measurement patterns, the sensitivity in each of the plurality of measurement patterns is obtained as described in the second embodiment with reference to FIG. 10B. For example, it is preferable to determine measurement parameters based on the average value or variations of sensitivities Sa and Sb at the same wavelength so as to maximize the errors caused when a plurality of measurement patterns on the substrate are measured. With this operation, it is also acceptable to maximize, for example, measurement errors corresponding to positions on a substrate 73 due to the thickness variations of the substrate 73.

A reason for the above description about the determination of parameter values will be described below. In step S136 in the first embodiment, a parameter value representing a low sensitivity indicating changes in measurement value with changes in central wavelength is selected for the purpose of reducing measurement errors accompanying process changes. On the other hand, the measuring apparatus (measurement pattern monitor) according to this embodiment needs to accurately detect changes in measurement value accompanying process changes. Accordingly, a process change can be accurately detected by selecting a parameter value representing a high sensitivity indicating a change in measurement value with a change in central wavelength.

In step S437, a detection unit 75 obtains the image information of a measurement pattern 72 in accordance with the parameter value of each of the plurality of measurement parameters determined in step S436, and the characteristic information of the measurement pattern 72 can be measured based on the image information under the control of the controller 1100. This step can be understood as a main measurement process of performing main measurement in accordance with the parameter value of each of the plurality of measurement parameters determined in step S436 (determination process). Examples of the characteristic information of the measurement pattern 72 include the position, signal intensity information, and waveform evaluation value information of the measurement pattern 72.

In step S438, the characteristic information of the measurement pattern 72 obtained in step S437 is compared with reference information to obtain the amount of change in the characteristic information of the measurement pattern. Examples of the reference information include the characteristic information and design value information of the measurement pattern 72 and the simulation result obtained in advance.

As described above, in the fourth embodiment, a sensitivity distribution is obtained concerning each measurement parameter, and parameter values to be used are determined for the respective measurement parameters based on the sensitivity distributions. This makes it possible to fast and accurately measure changes in the physical information of the measurement parameters in the measuring apparatus (measurement pattern monitor) according to this embodiment.

A lithography apparatus incorporating the above measuring apparatus will be described below. The lithography apparatus can be, for example, an exposure apparatus, an imprint apparatus, or an electron beam drawing apparatus. FIG. 13 is a schematic view showing the arrangement of an exposure apparatus EXA as an example of the lithography apparatus. The exposure apparatus EXA is a lithography apparatus which is used in a lithography process as a manufacturing process of an article or a device such as a semiconductor device or a liquid crystal display device and forms a pattern on a substrate 83. The exposure apparatus EXA exposes the substrate 83 via a reticle 31 serving as an original, thereby transferring the pattern of the reticle 31 to the substrate 83. In this embodiment, the exposure apparatus EXA employs a step-and-scan method, but it can also employ a step-and-repeat method or other exposure methods.

As shown in FIG. 13, the exposure apparatus EXA includes an illumination optical system 801, a reticle stage RS which holds the reticle 31, a projection optical system 32, a substrate stage WS which holds the substrate 83, a position measuring apparatus 550, and a controller 1200.

The illumination optical system 801 is an optical system that illuminates an illuminated surface using light from a light source unit 800. The light source unit 800 includes, for example, a laser. The laser includes an Arf excimer laser having a wavelength of about 193 nm, a KrF excimer laser having a wavelength of about 248 nm, or the like, but the type of light source is not limited to the excimer laser. For example, the light source unit 800 may use, as the light source, an $F_2$ laser having a wavelength of about 157 nm or EUV (Extreme Ultraviolet) having a wavelength of 20 nm or less.

In this embodiment, the illumination optical system 801 shapes the light from the light source unit 800 into slit light having a predetermined shape suitable for exposure, and illuminates the reticle 31. The illumination optical system 801 has a function of uniformly illuminating the reticle 31 and a polarizing illumination function. The illumination optical system 801 includes, for example, a lens, a mirror, an optical integrator, a stop, and the like, and is formed by arranging a condenser lens, a fly-eye lens, an aperture stop, a condenser lens, a slit, and an imaging optical system in this order.

The reticle 31 is formed of, for example, quartz. The reticle 31 is formed with a pattern (circuit pattern) to be transferred to the substrate 83.

The reticle stage RS holds the reticle 31 via a reticle chuck (not shown), and is connected to a reticle driving mechanism (not shown). The reticle driving mechanism includes a linear motor or the like, and can move the reticle 31 held by the reticle stage RS by driving the reticle stage RS in the X-axis direction, the Y-axis direction, the Z-axis direction, and the rotation directions around the respective axes. Note that the position of the reticle 31 is measured by a reticle position measuring unit of light oblique-incidence type (not shown), and the reticle 31 is arranged at a predetermined position via the reticle stage RS.

The projection optical system 32 has a function of imaging the light from an object plane in an image plane. In this embodiment, the projection optical system 32 projects the light (diffracted light) having passed through the pattern of the reticle 31 onto the substrate 83, thereby forming the image of the pattern of the reticle 31 on the substrate. As the projection optical system 32, an optical system formed from a plurality of lens elements, an optical system (catadioptric optical system) including a plurality of lens elements and at least one concave mirror, an optical system including a plurality of lens elements and at least one diffractive optical element such as kinoform, or the like is used.

A photoresist is applied onto the substrate 83. The substrate 83 is a processing target object to which the pattern of the reticle 31 is transferred, and includes a wafer, a liquid crystal substrate, another processing target substrate, or the like.

The substrate stage WS holds the substrate 83 via a substrate chuck (not shown), and is connected to a substrate driving mechanism (not shown). The substrate driving mechanism includes a linear motor or the like, and can move the substrate 83 held by the substrate stage WS by driving the substrate stage WS in the X-axis direction, the Y-axis direction, the Z-axis direction, and the rotation directions around the respective axes. Further, a reference plate 39 is provided on the substrate stage WS.

The position of the reticle stage RS and the position of the wafer stage WS are monitored by, for example, a 6-axis laser interferometer 91 or the like, and the reticle stage RS and the substrate stage WS are driven at a constant speed ratio under the control of the controller 1200.

The controller 1200 is formed by a computer (information processing apparatus) including a CPU, a memory, and the like and, for example, operates the exposure apparatus EXA by comprehensively controlling respective units of the exposure apparatus EXA in accordance with a program stored in a storage unit. The controller 1200 controls exposure processing of transferring the pattern of the reticle 31 to the substrate 83 by exposing the substrate 83 via the reticle 31. Further, in this embodiment, the controller 1200 controls measurement processing in the position measuring apparatus 550 and correction processing (calculation processing) of a measurement value obtained by the position measuring apparatus 550. In this manner, the controller 1200 also functions as a part of the position measuring apparatus 550.

In the exposure apparatus EXA, the light (diffracted light) having passed through the reticle 31 is projected onto the substrate 83 via the projection optical system 32. The reticle 31 and the substrate 83 are arranged in an optically conjugate relationship. The pattern of the reticle 31 is transferred to the substrate 83 by scanning the reticle 31 and the substrate 83 at a speed ratio of a reduction ratio of the projection optical system 32.

The position measuring apparatus 550 is a measuring apparatus for measuring the position of a target object. In this embodiment, the position measuring apparatus 550 measures the position of a mark such as an alignment mark provided in the substrate 83. The position measuring apparatus 550 includes a wavelength variable unit. The wavelength variable unit is constituted by a wavelength variable element and a holding member. The controller drives the wavelength variable unit in the X direction by using a driving mechanism (not shown).

With reference to FIG. 14, the sequence of the exposure processing of transferring the pattern of the reticle 31 onto the substrate 83 by exposing the substrate 83 via the reticle 31 will be described. As has been described above, the exposure processing is performed by the controller 1200 comprehensively controlling the respective units of the exposure apparatus EXA.

In step S101, the substrate 83 is loaded in the exposure apparatus EXA. In step S102, the surface (height) of the substrate 83 is detected by a shape measuring apparatus (not shown) to measure the surface shape of the entire substrate 83.

In step S103, calibration is performed. More specifically, based on the designed coordinate position of the reference mark provided in the reference plate 39 in the stage coordinate system, the wafer stage WS is driven so as to position the reference mark on the optical axis of the position measuring apparatus 550. Then, the positional shift of the reference mark with respect to the optical axis of the position measuring apparatus 550 is measured, and the stage coordinate system is reset based on the positional shift such that the origin of the stage coordinate system coincides with the optical axis of the position measuring apparatus 550. Next, based on the designed positional relationship between the optical axis of the position measuring apparatus 550 and the optical axis of the projection optical system 32, the substrate stage WS is driven so as to position the reference mark on the optical axis of the exposure light. Then, the positional shift of the reference mark with respect to the optical axis of the exposure light is measured via the projection optical system 32 by a TTL (Through The Lens) measurement system.

In step S104, based on the result of calibration obtained in step S103, the baseline between the optical axis of the position measuring apparatus 550 and the optical axis of the projection optical system 32 is determined. In step S105, the position measuring apparatus 550 measures the position of the mark provided in the substrate 83.

In step S106, global alignment is performed. More specifically, based on the measurement result obtained in step S105, the shift, the magnification, and the rotation with respect to the array of shot regions on the substrate 83 are calculated, and the regularity of the array of the shot regions is obtained. Then, a correction coefficient is obtained from the regularity of the array of the shot regions and the baseline, and the substrate 83 is aligned with the reticle 31 (exposure light) based on the correction coefficient.

In step S107, the substrate 83 is exposed while scanning the reticle 31 and the substrate 83 in a scanning direction (Y direction). At this time, based on the surface shape of the substrate 83 measured by the shape measuring apparatus, an operation of sequentially adjusting the surface of the substrate 83 to the imaging plane of the projection optical system 32 is also performed by driving the substrate stage WS in the Z direction and the tilt direction.

In step S108, it is determined whether exposure for all the shot regions of the substrate 83 is completed (that is, whether there is no unexposed shot region). If exposure for all the shot regions of the substrate 83 is not completed, the process returns to step S107, and steps S107 and S108 are repeated until exposure for all the shot regions is completed. On the other hand, if exposure for all the shot regions of the substrate 83 is completed, the process advances to step S109, and the substrate 83 is unloaded from the exposure apparatus EXA.

In this embodiment, the position of the mark is measured by using each of a plurality of different measurement parameters, and the sensitivity of each measurement value corresponding to measurement parameter variations is calculated concerning at least two or more measurement parameters. Measurement parameters to be used for measurement are determined based on the sensitivities. This makes it possible to reduce errors in alignment measurement and implement accurate alignment. Accordingly, this embodiment can provide a position measuring apparatus that can fast and accurately measure the positions of the patterns on a substrate.

An article manufacturing method of manufacturing an article by using the above lithography apparatus will be exemplarily described. The article manufacturing method is suitable for, for example, manufacturing an article such as a device (a semiconductor device, a magnetic storage medium, a liquid crystal display device, or the like). The manufacturing method includes a step of exposing, by using an exposure apparatus EXA, a substrate with a photosensitive agent applied thereon (forming a pattern on the substrate), and a step of developing the exposed substrate (processing the substrate). In addition, the manufacturing method can include other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article. Note that the above-described article manufacturing method may be performed by using a lithography apparatus such as an imprint apparatus or a drawing apparatus.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2022-097424, filed Jun. 16, 2022, Japanese Patent Application No. 2023-030136, filed Feb. 28, 2023 which are hereby incorporated by reference herein in their entirety.

What is claimed is:

1. A measuring method comprising:

performing preliminary measurement including:

obtaining an image of a measurement object, while changing a combination of parameter values of at least two different measurement parameters, concerning each combination, to obtain a plurality of images of the measurement object; and calculating a measurement value for each of the obtained plurality of images;

performing processing to obtain a sensitivity distribution as a distribution of sensitivities indicating a change in measurement value with a change in a parameter value concerning each of the at least two measurement parameters, the performing processing including:

generating a composite image from the obtained plurality of images;

estimating a measurement value obtained with a combination different from the combination having undergone the preliminary measurement based on the composite image and the measurement values obtained in the preliminary measurement; and calculating the sensitivity distribution concerning each of the at least two measurement parameters based on the estimated measurement value;

determining a parameter value to be used concerning each of the at least two measurement parameters based on the sensitivity distribution concerning each of the at least two measurement parameters; and performing main measurement in accordance with the determined parameter value of each of the at least two measurement parameters.

2. The method according to claim 1, wherein in the performing preliminary measurement and the performing main measurement, position information of the measurement object is measured.

3. The method according to claim 2, wherein the at least two measurement parameters include a central wavelength of light illuminating the target and a wavelength width of the light.

4. The method according to claim 2, wherein the at least two measurement parameters include:

a central wavelength;

a wavelength width; and at least one of a σ value of light illuminating the target, a polarization characteristic in an optical path of a measuring apparatus that measures the target, a transmittance of an ND filter arranged in the optical path, a position of the target, or a tilt of the target.

5. The method according to claim 2, wherein one of the at least two measurement parameters includes the position of the measurement object in a direction along an optical path of a position detection apparatus that detects the position of the measurement object.

6. The method according to claim 2, wherein in the determining, the parameter value to be used is determined concerning each of the at least two measurement parameters based on the sensitivity distribution concerning each of the at least two measurement parameters and a weighting function given to each of the at least two measurement parameters.

7. The method according to claim 2, wherein in the determining, at least one of an average value or a variation of the sensitivity distribution is calculated based on the sensitivity distribution concerning each of a plurality of measurement objects, and the parameter value to be used is determined based on a sensitivity of the at least one of the average value or the variation of the sensitivity distribution.

8. The method according to claim 1, wherein in the determining, the parameter value to be used is determined so as to make a sensitivity in the sensitivity distribution become worse than a predetermined sensitivity in the parameter value to be used.

9. The method according to claim 1, wherein in the determining, the parameter value to be used is determined so as to make a sensitivity in the sensitivity distribution become lower than a predetermined sensitivity in the parameter value to be used.

10. The method according to claim 1, wherein in the determining, the parameter value to be used is determined so as to make a sensitivity in the sensitivity distribution become a minimum in the parameter value to be used.

11. The method according to claim 1, wherein in the performing preliminary measurement and the performing main measurement, signal intensity information or waveform evaluation value information of measurement object is measured.

12. The method according to claim 1, wherein in the determining, the parameter value to be used is determined so as to make a sensitivity in the sensitivity distribution become more sensitive than a predetermined sensitivity in the parameter value to be used.

13. The method according to claim 1, wherein in the determining, the parameter value to be used is determined so as to make a sensitivity in the sensitivity distribution become higher than a predetermined sensitivity in the parameter value to be used.

14. The method according to claim 1, wherein in the determining, the parameter value to be used is determined so as to make a sensitivity in the sensitivity distribution become a maximum in the parameter value to be used.

15. An article manufacturing method comprising:

measuring a position of a mark on a substrate in accordance with the measuring method according to claim 1, the measurement object being the mark on the substrate;

transferring a pattern to the substrate based on the position of the mark; and obtaining an article by processing the substrate to which the pattern is transferred.

16. A measuring apparatus comprising:

a measuring unit; and a controller configured to:

control the measuring unit to perform preliminary measurement, including:

obtaining an image of a measurement object, while changing a combination of parameter values of at least two different measurement parameters, to obtain a plurality of images of the measurement object; and calculating a measurement value for each of the obtained plurality of images;

obtain a sensitivity distribution as a distribution of sensitivities indicating a change in measurement value with a change in a parameter value concerning each of the at least two measurement parameters, in obtaining the sensitivity distribution, the controller:

generates a composite image from the obtained plurality of images;

estimates a measurement value obtained with a combination different from the combination having undergone the preliminary measurement based on the composite image and the measurement values obtained in the preliminary measurement; and calculates the sensitivity distribution concerning each of the at least two measurement parameters based on the estimated measurement value;

determine a parameter value to be used concerning each of the at least two measurement parameters based on the sensitivity distribution concerning each of the at least two measurement parameters; and control the measuring unit to perform main measurement in accordance with the determined parameter value of each of the at least two measurement parameters.

17. The apparatus according to claim 16, further comprising:

a wavelength variable unit configured to change a wavelength of light illuminating a measurement object, wherein the controller controls the wavelength variable unit based on the parameter value determined for each of the at least two measurement parameters.

18. The apparatus according to claim 17, wherein the wavelength variable unit includes:

a wavelength variable element having a transmission wavelength changing along a predetermined direction; and a driving mechanism configured to drive the wavelength variable element.

19. The apparatus according to claim 18, wherein:

the wavelength variable unit is configured to change a central wavelength and a wavelength width of light illuminating a measurement object, and the at least two measurement parameters include the central wavelength and the wavelength width.

20. The apparatus according to claim 16, wherein the measuring unit measures position information of the measurement object.

21. A lithography apparatus comprising:

the measuring apparatus according to claim 16 and configured to measure a position of the measurement object, which is a mark provided on a substrate; and a positioning mechanism configured to position the substrate based on the position of the mark measured by the measuring apparatus, wherein the lithography apparatus is configured to transfer a pattern of the substrate.

22. An article manufacturing method comprising:

transferring a pattern to a substrate using the lithography apparatus according to claim 21; and obtaining an article by processing the substrate to which the pattern is transferred.

\* \* \* \* \*